US012631958B2

(12) United States Patent
Shackleton et al.

(10) Patent No.: US 12,631,958 B2
(45) Date of Patent: May 19, 2026

(54) SYSTEM INCLUDING AN INSERTABLE HEATING MEMBER OR AN INSERTABLE THERMAL SHIELD AND A METHOD OF USING THE SAME

(71) Applicant: CANON KABUSHIKI KAISHA, Tokyo (JP)

(72) Inventors: Steven C. Shackleton, Austin, TX (US); Seth J. Bamesberger, Austin, TX (US); Byung-Jin Choi, Austin, TX (US); Timothy Brian Stachowiak, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 46 days.

(21) Appl. No.: 18/390,688

(22) Filed: Dec. 20, 2023

(65) Prior Publication Data

US 2025/0205966 A1 Jun. 26, 2025

(51) Int. Cl.
*G03F 7/00* (2006.01)
*B29C 33/02* (2006.01)
*B29C 35/02* (2006.01)
*B29C 64/295* (2017.01)

(52) U.S. Cl.
CPC ............ *G03F 7/0002* (2013.01); *B29C 33/02* (2013.01); *B29C 35/02* (2013.01); *B29C 64/295* (2017.08)

(58) Field of Classification Search
CPC .............................. B29C 64/295; B29C 33/02
See application file for complete search history.

(56) References Cited

U.S. PATENT DOCUMENTS

| | | | |
|---|---|---|---|
| 5,679,610 A | 10/1997 | Matsuda | |
| 5,947,718 A | 9/1999 | Weaver | |
| 6,605,955 B1 | 8/2003 | Costello | |
| 7,312,422 B2 | 12/2007 | Wintenberger | |
| 9,934,991 B2 | 4/2018 | Lin | |
| 11,275,309 B2 | 3/2022 | Kurosawa | |
| 2003/0015294 A1 | 1/2003 | Wang | |

(Continued)

FOREIGN PATENT DOCUMENTS

| | | | | |
|---|---|---|---|---|
| EP | 0450482 A2 * | 10/1991 | ........... | B29C 51/424 |
| JP | 2004335808 A * | 11/2004 | | |

(Continued)

OTHER PUBLICATIONS

Machine translation of JP 2004335808, retrieved from USPTO database Aug. 21, 2025 (Year: 2025).*

(Continued)

*Primary Examiner* — Timothy Kennedy
(74) *Attorney, Agent, or Firm* — Abel Schillinger, LLP

(57) ABSTRACT

A system can include a substrate chuck, an actinic radiation source for curing a photocurable composition, and an insertable object that can be moved between a retracted state and an inserted state. The object can be a thermal shield or a heating member including a heating element. When in an inserted state, the heating element can be disposed between the substrate chuck and the actinic radiation source, or the thermal shield can be disposed between a substrate and the substrate chuck. During heating, the heating member, the thermal shield, or both can help to reduce the amount of heat received by the substrate chuck, a positioning stage, or both.

19 Claims, 20 Drawing Sheets

(56) References Cited

U.S. PATENT DOCUMENTS

2004/0226460 A1 * 11/2004 George .................. B82Y 10/00
                                                                101/17
2005/0274693 A1 * 12/2005 Heidari ................. B29C 43/021
                                                                438/20
2006/0242967 A1    11/2006 Lin
2022/0317566 A1    10/2022 Tanabe et al.
2022/0384205 A1    12/2022 Shackleton et al.

FOREIGN PATENT DOCUMENTS

JP        2013074258 A   *  4/2013    ............ B82Y 10/00
KR        100793329 B1      1/2008
WO        00068625 A1      11/2000

OTHER PUBLICATIONS

Machine translation of JP 2013074258, retrieved from USPTO database Aug. 21, 2025 (Year: 2025).*
Transparent ITO heaters; Cell MicroControls; accessed Dec. 1, 2023; p. 1.
Transparent Heaters—Thin Film Devices; https://tfdinc.com/products/transparent-heaters/; accessed Oct. 19, 2023; pp. 1-13.
U.S. Appl. No. 18/332,010, filed Jun. 9, 2023; specification and drawings; pp. 1-55.
Optical Solutions ITO; https://www.opticalsolutions.it/en/optical-filters-and-coatings-en/ito-en/ito/; accessed Oct. 19, 2023; pp. 1-2.
Maniscalco et al.; "Thin Film Thickness Measurements Using Scanning White Light Interferometry"; Thin Solid Films, 550; Elsevier B.V. (2014); pp. 10-16.
Zhang et al.; "Low Resistance Indium Tin Oxide Contact to n—GaAs Nanowires"; Semicon. Sci. Technol., 29; IOP Publishing, Ltd. (2014); pp. 1-5.

* cited by examiner

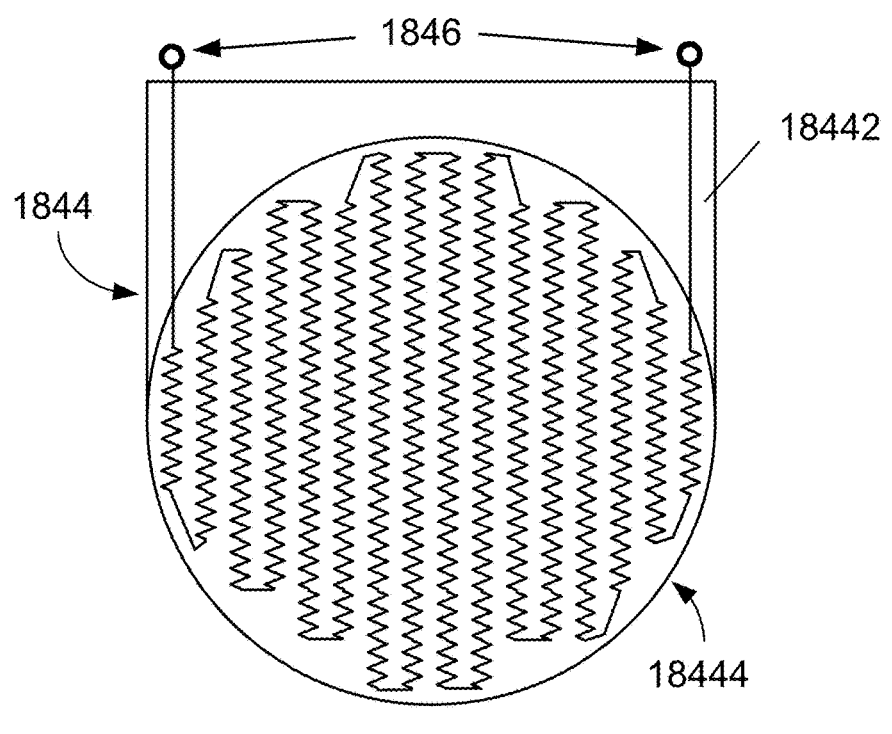
FIG. 17
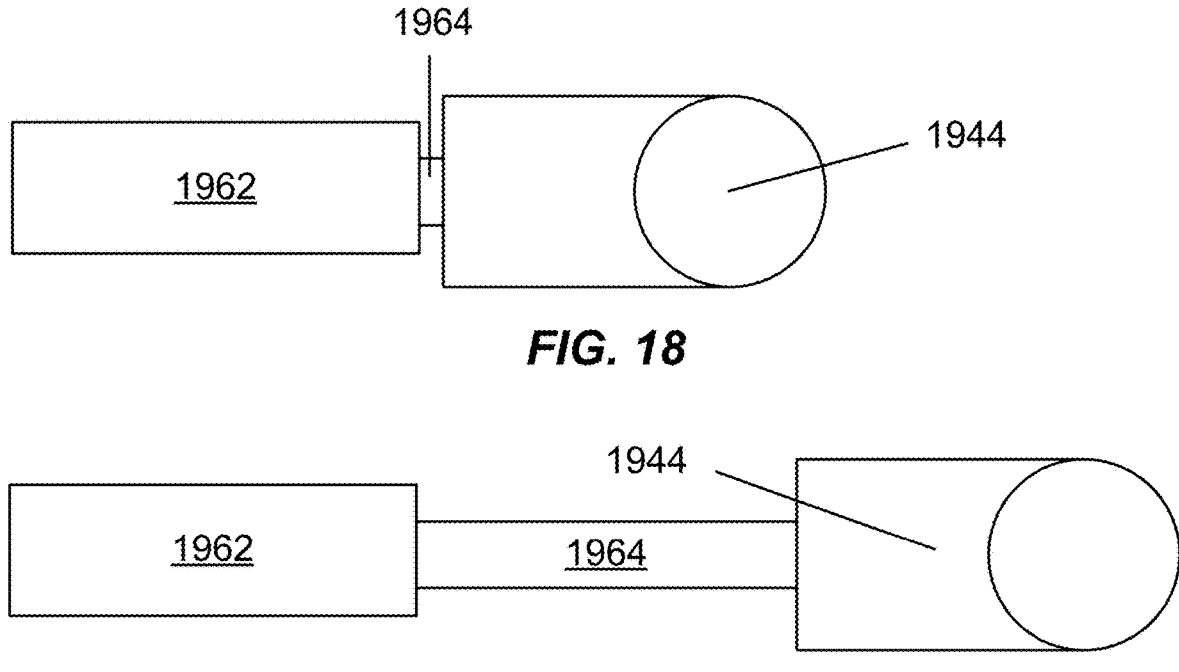
FIG. 18
FIG. 19

SYSTEM INCLUDING AN INSERTABLE HEATING MEMBER OR AN INSERTABLE THERMAL SHIELD AND A METHOD OF USING THE SAME

FIELD OF THE DISCLOSURE

The present disclosure relates to systems including insertable heating members or insertable thermal shields and methods of using the same.

RELATED ART

Ink-jet Adaptive Planarization (IAP) is used in microelectronic fabrication. As dimensions of microelectronic components continue to become smaller, processes, including IAP, become more difficult. IAP can be performed such that a photocurable composition is at a temperature greater than room temperature while the photocurable composition is exposed to actinic radiation. A need exists for a system designed to allow for heating the photocurable composition during exposure while still maintaining acceptable throughput when forming the planarization layer.

SUMMARY

In as aspect, a system can include a substrate chuck, an actinic radiation source for curing a photocurable composition, and an insertable heating member including a heating element. In an inserted state, the heating element can be disposed between the substrate chuck and the actinic radiation source, and, in a retracted state, the heating element may not be disposed between the substrate chuck and the actinic radiation source.

In an implementation, the system further includes a first positioning device and a second positioning device. The first positioning device is coupled to the insertable heating member, wherein the first positioning device is configured to move the insertable heating member from the retracted state to the inserted state. The second positioning device is coupled to the insertable heating member, wherein the second positioning device is configured to move the insertable heating member from the inserted state to the retracted state.

In another implementation, the system further includes an insertable thermal shield, wherein, in the inserted state, the insertable thermal shield is disposed between the substrate chuck and the actinic radiation source, and in the retracted state, the insertable thermal shield is not disposed between the substrate chuck and the actinic radiation source.

In a particular implementation, the system further includes a first positioning device coupled to the insertable thermal shield, wherein the first positioning device is configured to move the insertable thermal shield from the retracted state to the inserted state; and a second positioning device coupled to the insertable thermal shield, wherein the second positioning device is configured to move the insertable thermal shield from the inserted state to the retracted state.

In another particular implementation, the system further includes a heating member positioning device coupled to the insertable heating member, wherein the heating member positioning device is configured to move the insertable heating member from the retracted state to the inserted state and from the inserted state to the retracted state. The system can further include a thermal shield member positioning device coupled to the insertable thermal shield, wherein the heating member positioning device is configured to move the insertable thermal shield from the retracted state to the inserted state and from the inserted state to the retracted state.

In a further particular implementation, the substrate chuck includes a chucking surface and lift pins, wherein the lift pins are configured to lift a substrate from the chucking surface when the insertable thermal shield is in the inserted state.

In another implementation, the heating element is configured to transmit at least 70% of an actinic radiation from the actinic radiation source through a thickness of the heating element.

In still another implementation, the substrate chuck includes a thermal shield and a chucking surface, wherein the thermal shield is disposed along the chucking surface.

In yet another implementation, the system further includes a positioning stage, wherein the substrate chuck includes a chucking surface and a thermal shield, wherein a center of the thermal shield is disposed between the chucking surface and the positioning stage.

In a further implementation, the system further includes a structure including the insertable heating member and a thermal shield, wherein the thermal shield is disposed between the heating element and the substrate chuck.

In another aspect, a system can include a substrate chuck, an actinic radiation source for curing a photocurable composition, and an insertable thermal shield. In an inserted state, the insertable thermal shield can be disposed between the substrate chuck and the actinic radiation source, and in a retracted state, the insertable thermal shield may not be disposed between the substrate chuck and the actinic radiation source.

In an implementation, the system further includes a first positioning device and a second positioning device. The first positioning device is coupled to the insertable thermal shield, wherein the first positioning device is configured to move the insertable thermal shield from the retracted state to the inserted state. The second positioning device is coupled to the insertable thermal shield, wherein the second positioning device is configured to move the insertable thermal shield from the inserted state to the retracted state.

In another implementation, the substrate chuck includes a lift pin including a substrate contacting portion and a vertical portion, and the insertable thermal shield is not disposed directly over or directly under the vertical portion of the lift pin when the insertable thermal shield is in the inserted state.

In yet another implementation, the substrate chuck further includes a lift pin, wherein the insertable thermal shield defines a slot such that the lift pin is within the slot when the insertable thermal shield is in the inserted state.

In a further implementation, the insertable thermal shield includes a first layer of a relatively lower thermally conductive material and a second layer of a relatively higher thermally conductive material, wherein the first layer is disposed between the second layer and the substrate chuck.

In a further aspect, a method can include moving a thermal component to a position adjacent to a photocurable composition and a substrate, wherein the thermal component is a thermal shield or a heating member including a heating element; heating the photocurable composition; exposing the photocurable composition to actinic radiation while the photocurable composition is at a temperature higher than an ambient temperature; and, after heating the photocurable composition, moving the thermal component such that it does not directly overlie or directly underlie the photocurable composition and the substrate.

In an implementation, moving the thermal component includes moving the heating member.

In a particular implementation, the method further includes, before heating the photocurable composition, moving a thermal shield such that the thermal shield is disposed between and a substrate chuck and the substrate; and, after heating the photocurable composition, moving the thermal shield such that the thermal shield is not disposed between the substrate chuck and the substrate.

In another implementation, moving the thermal component includes moving the thermal shield.

In a particular implementation, the method further includes lifting the substrate such that it is spaced apart from a chucking surface of a substrate chuck, wherein moving the thermal shield is performed such that the thermal shield extends beyond opposite points along a peripheral edge of the substrate.

In a further implementation, the method further includes placing a superstrate on a layer of the photocurable composition, wherein the layer of the photocurable composition is disposed between the superstrate and the substrate, and the substrate is on a substrate chuck coupled to a positioning stage, while the positioning stage in a first position. The method can further include exposing the photocurable composition to the actinic radiation is performed such that a positioning stage temperature of the positioning stage is at least 30° C. below a heated photocurable composition temperature of the photocurable composition while the photocurable composition is exposed to the actinic radiation to form a photocured planarization layer under the superstrate, while the positioning stage is in a second position. The method can include removing the superstrate from the photocured planarization layer while the positioning stage is in the first position; removing a stack of the photocured planarization layer and the substrate from the substrate chuck; and baking the stack at a baking temperature for a soak time. The heated photocurable composition temperature of the photocurable composition is selected based on the baking temperature for the soak time.

BRIEF DESCRIPTION OF THE DRAWINGS

Implementations are illustrated by way of example and are not limited to the accompanying figures.

4

Figure 10:
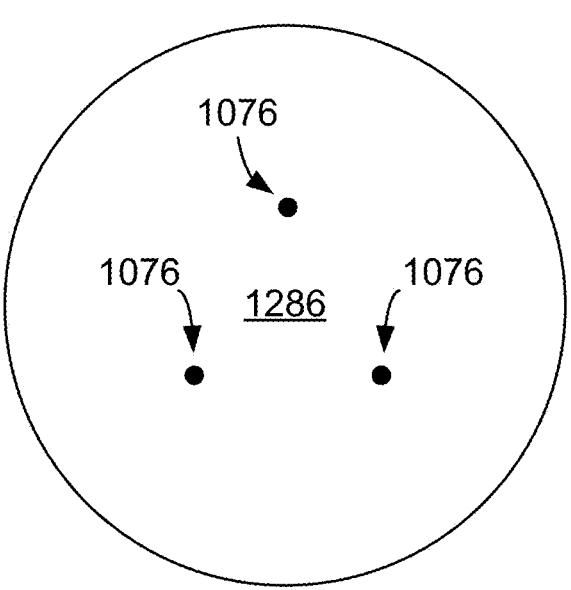

FIG. 10 includes a top view of a substrate chuck and lift pins in accordance with another implementation before inserting a thermal shield.

Figure 11:
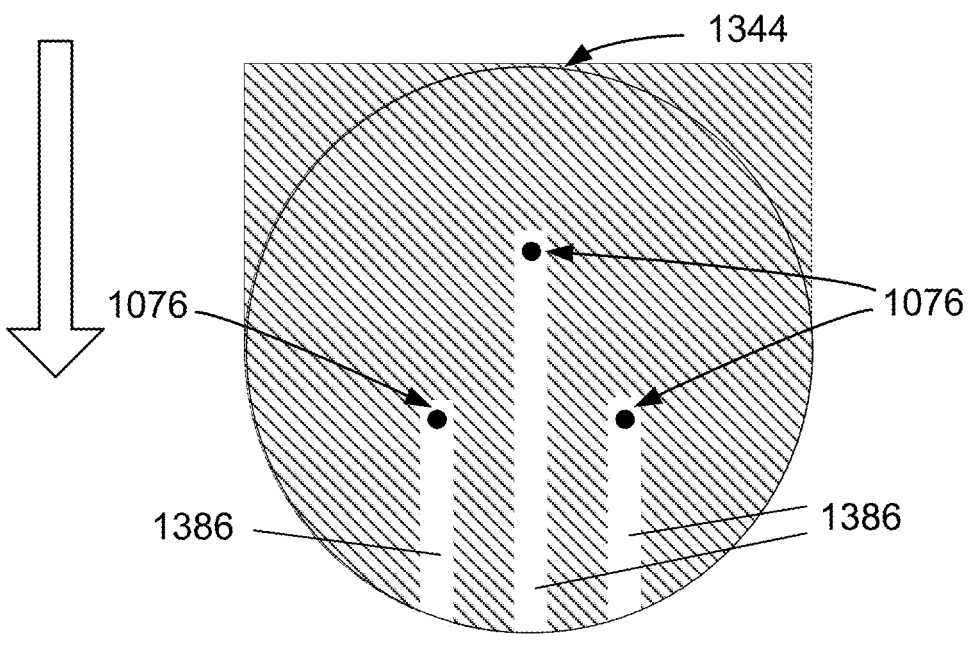

FIG. 11 includes a top view of a substrate chuck and lift pins of FIG. 10 after inserting a thermal shield.

Figure 12:
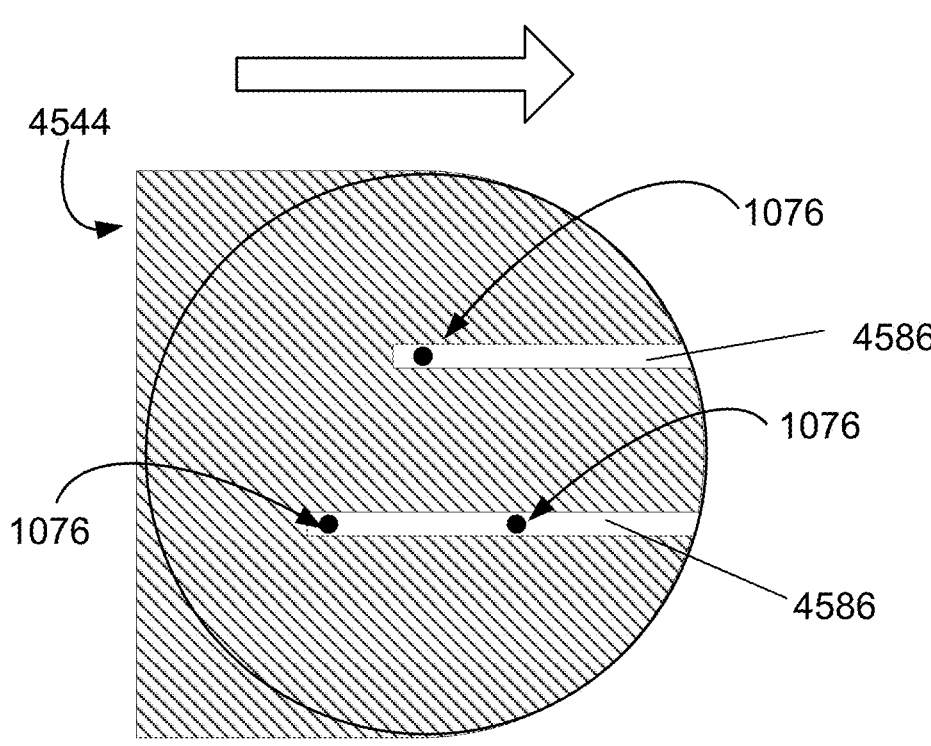

FIG. 12 includes a top view of a substrate chuck and lift pins of FIG. 10 after inserting an alternative thermal shield.

Figure 13:
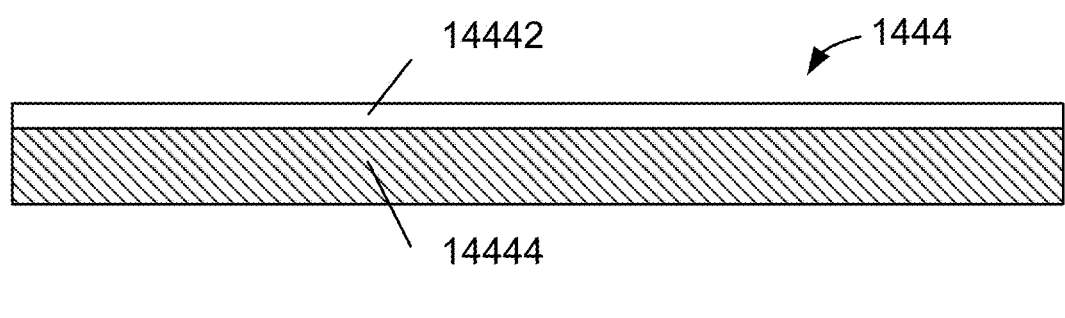

FIG. 13 includes a cross-sectional view of a thermal shield that includes a layer of relatively lower thermal conductivity material and a layer of relatively higher thermal conductivity material.

Figure 14:
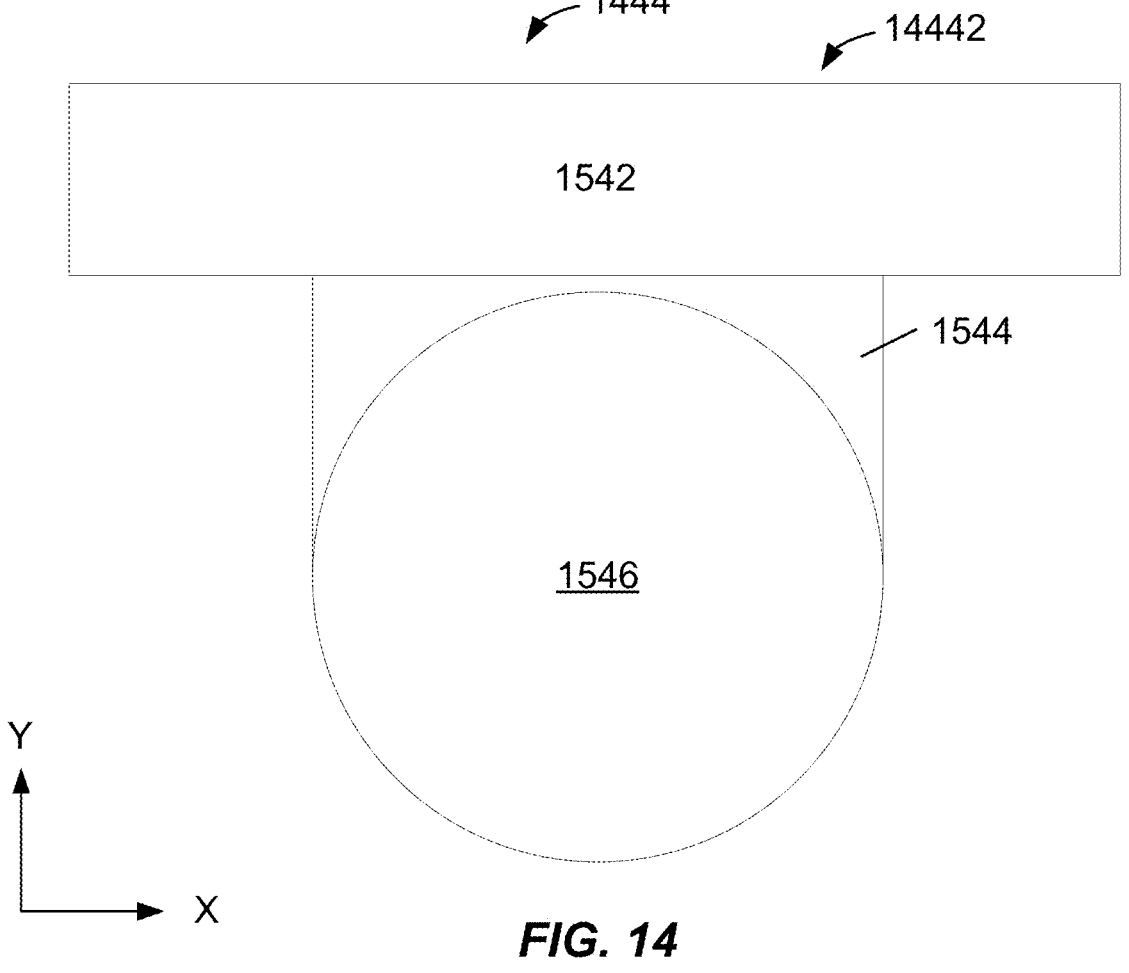

FIG. 14 includes a top view of the thermal shield of FIG. 13.

Figure 15:
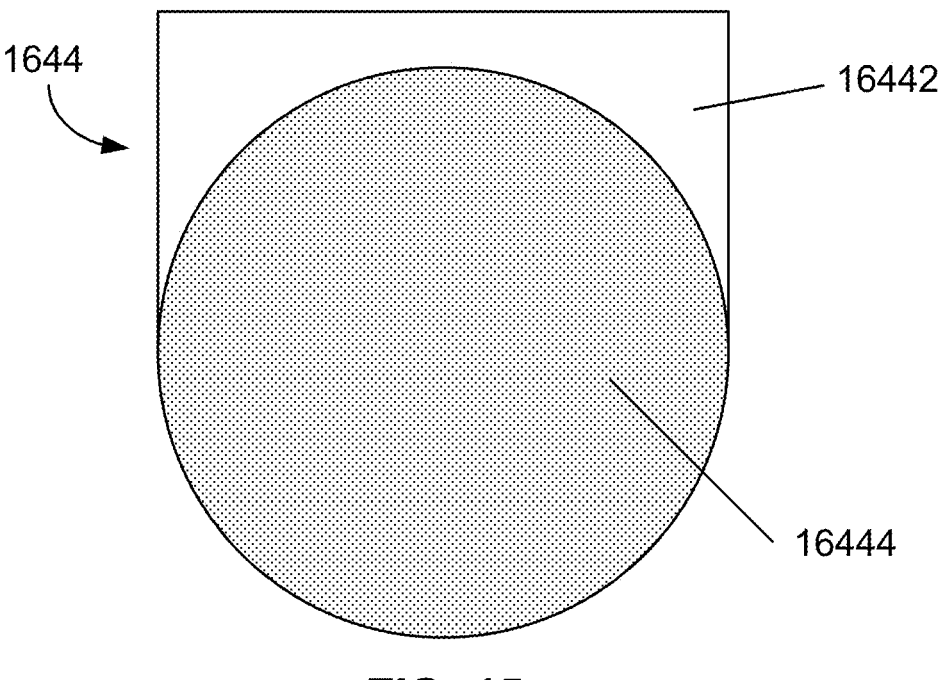

FIG. 15 includes a top view of a heating member including a transparent heating element in accordance with an implementation.

Figure 16:
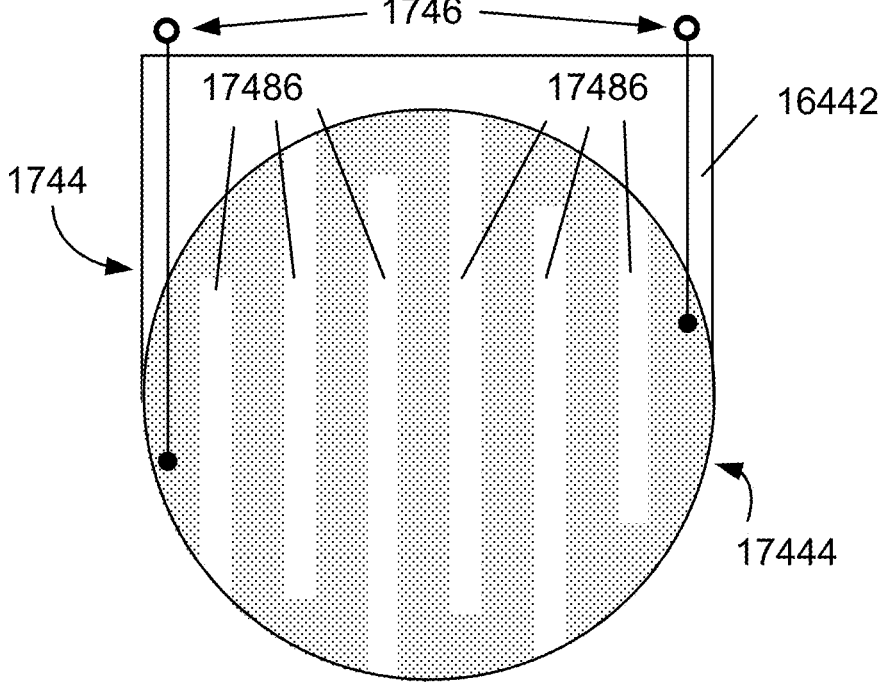

FIG. 16 includes a top view of a heating member including a transparent heating element in accordance another implementation.

FIG. 17 includes a top view of a heating member including a transparent heating element in accordance with a further implementation.

FIG. 18 includes a top view of a positioning device and an object in a retracted state in accordance with an implementation.

FIG. 19 includes a top view of the positioning device and the object of FIG. 18 in an inserted state.

Figure 20:
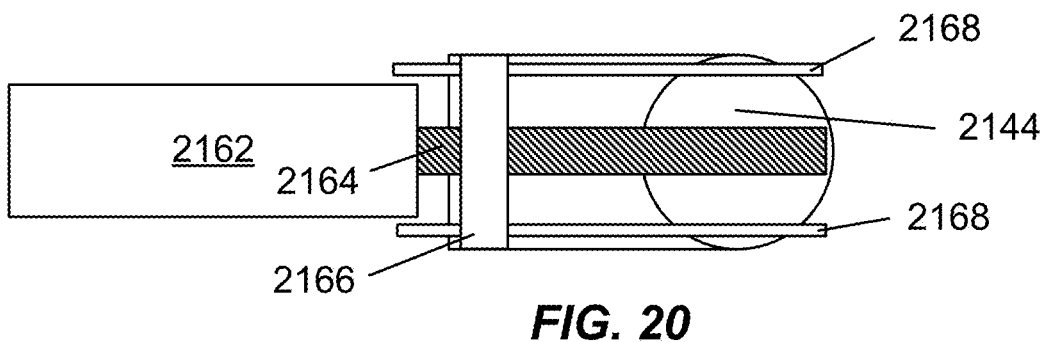

FIG. 20 includes a bottom view of a positioning device and an object in a retracted state in accordance with another implementation.

Figure 21:
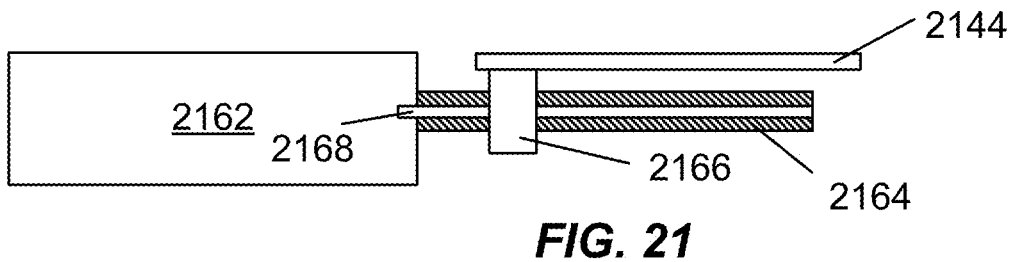

FIG. 21 includes a side view of the positioning device and the object in FIG. 20.

Figure 22:
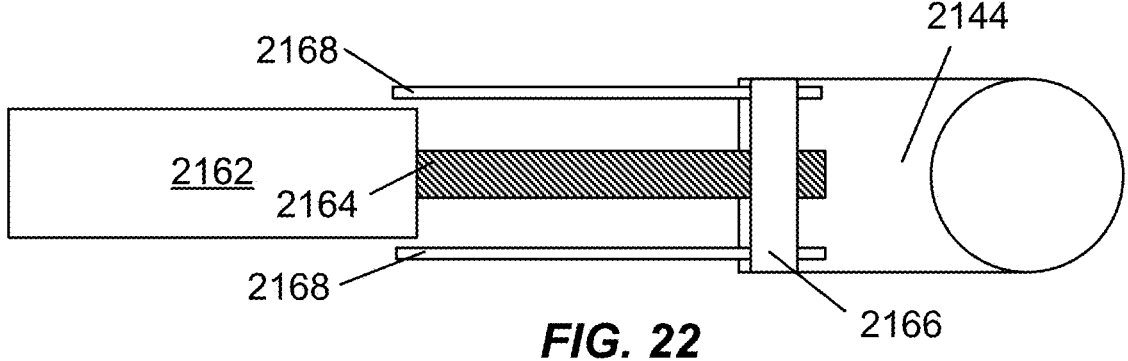

FIG. 22 includes a bottom view of the positioning device and the object of FIG. 20 in an inserted state.

Figure 23:
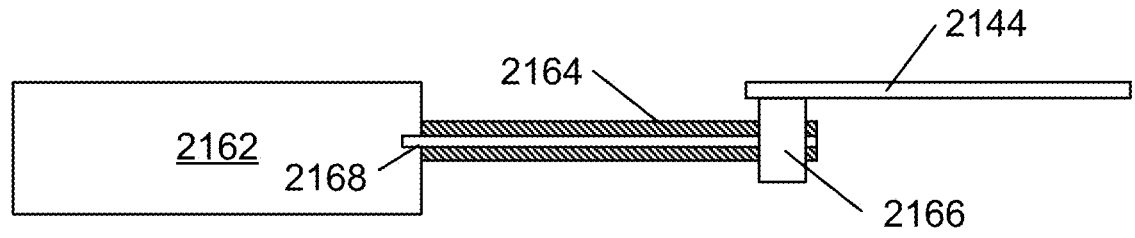

FIG. 23 includes a side view of the positioning device and the object in FIG. 22.

Figure 24:
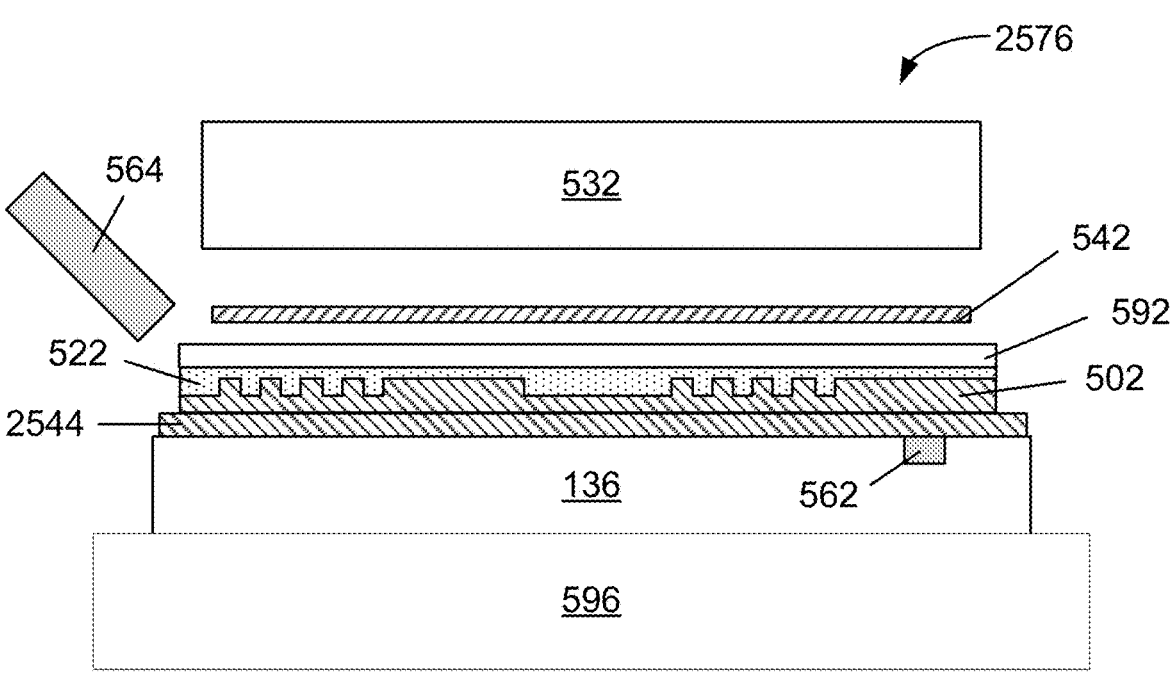

FIG. 24 includes a cross-sectional view of a portion of a station that includes an insertable heating member and thermal shield in a fixed position.

Figure 25:
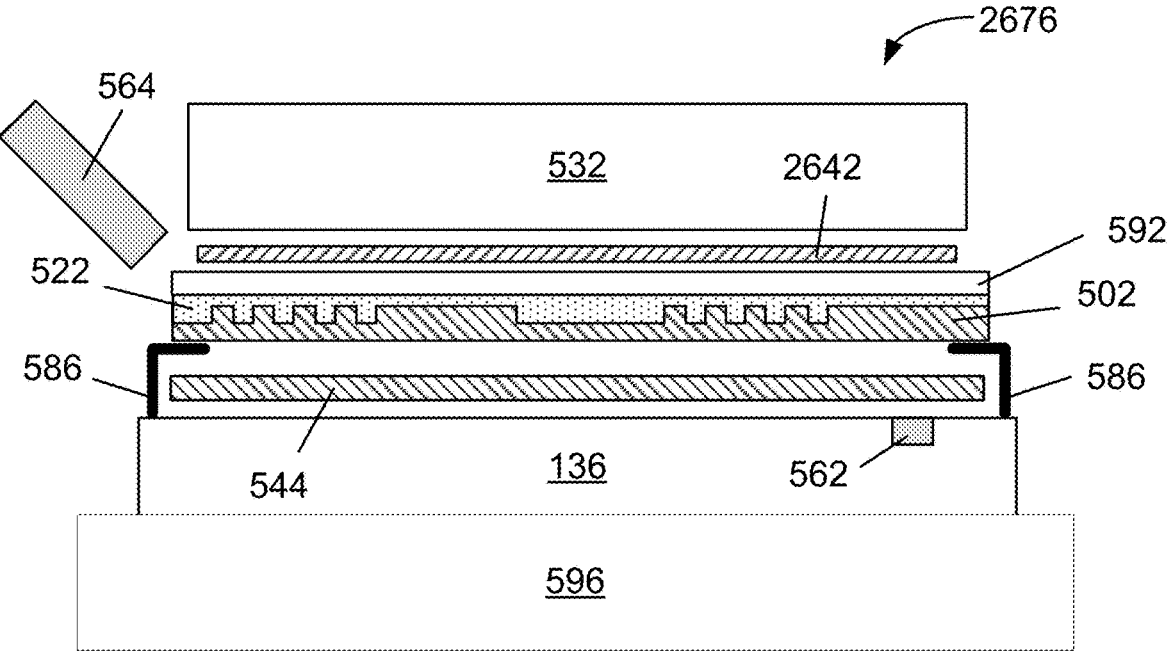

FIG. 25 includes a cross-sectional view of a portion of a station that includes a heating member in a fixed position and an insertable thermal shield.

Figure 26:
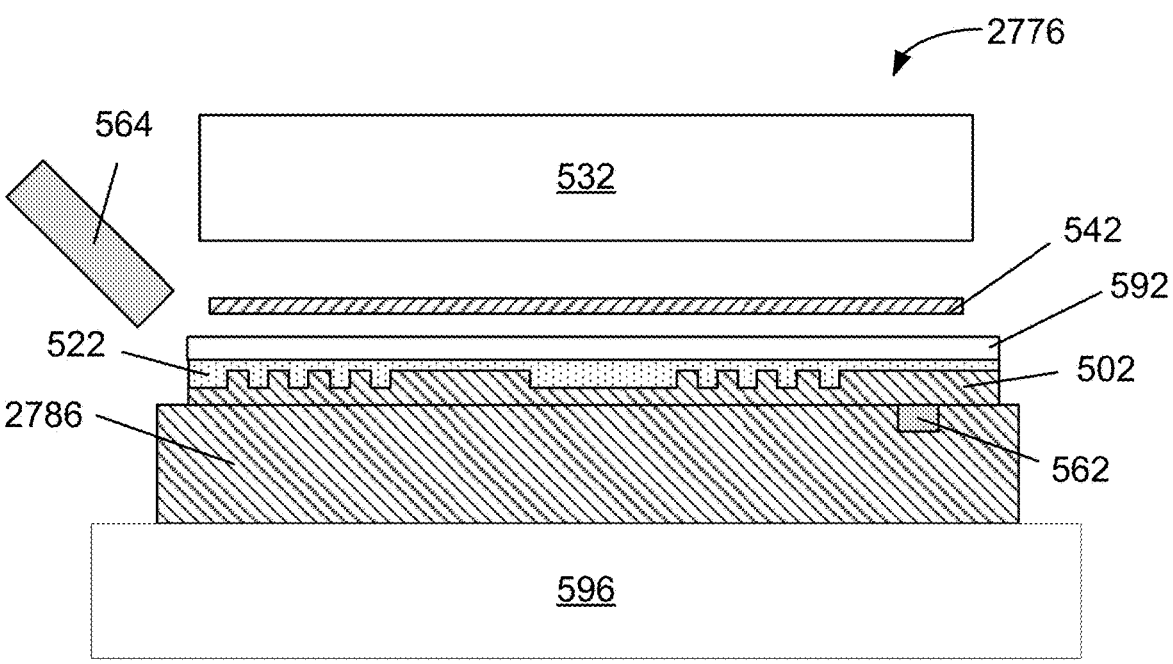

FIG. 26 includes a cross-sectional view of a portion of a station that includes an insertable heating member and a substrate chuck including a low thermal conductivity material.

Figure 27:
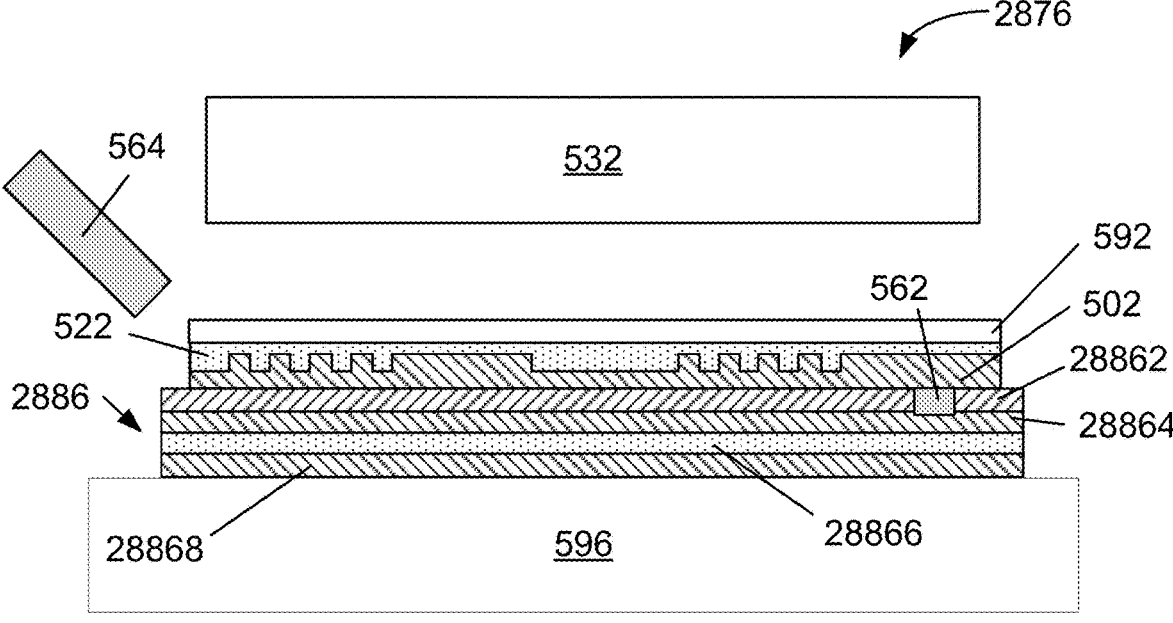

FIG. 27 includes a cross-sectional view of a portion of a station that includes a substrate chuck including a heated chuck section, a thermal shield section, an active cooling section, and another thermal shield section.

Figure 28:
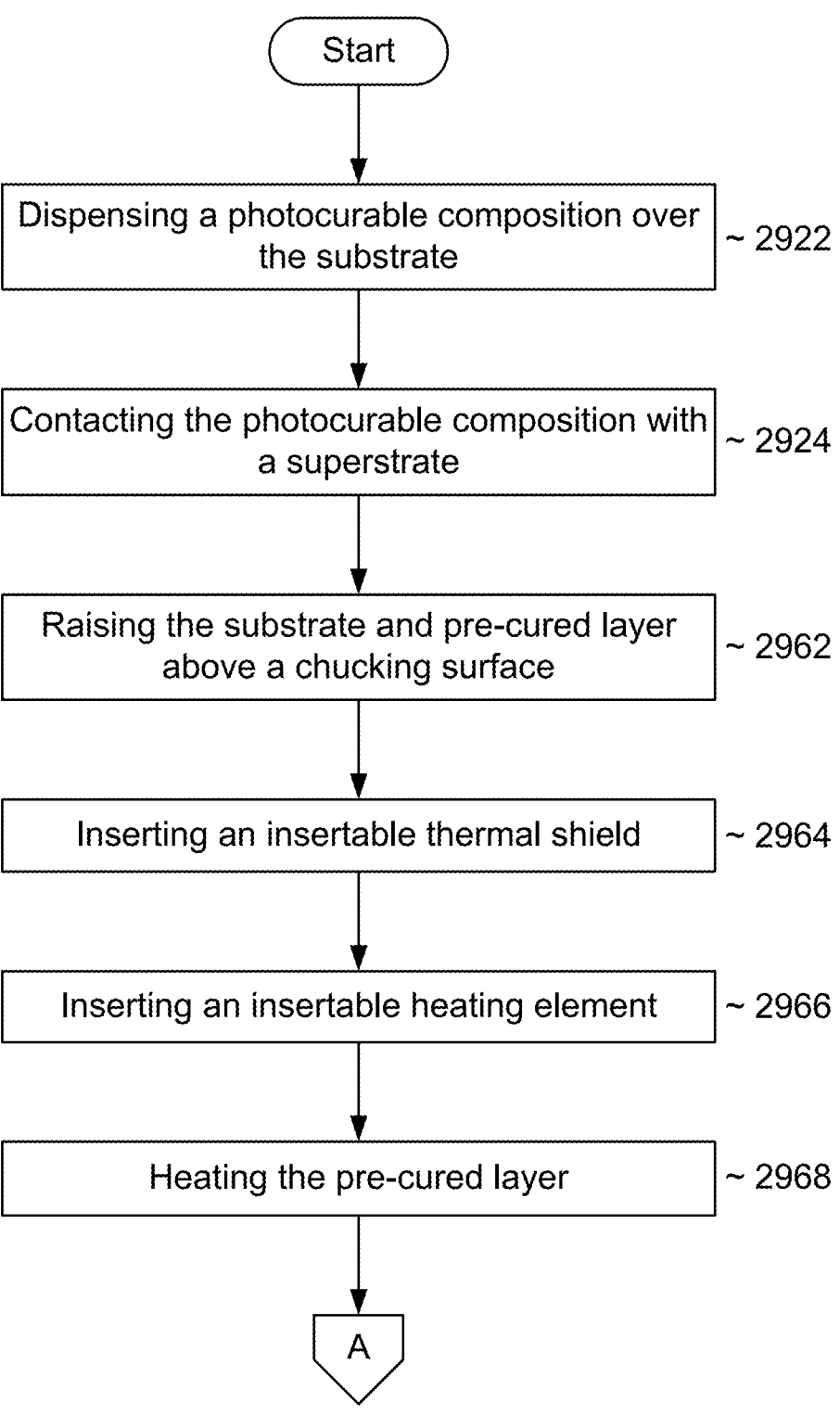
Figure 29:
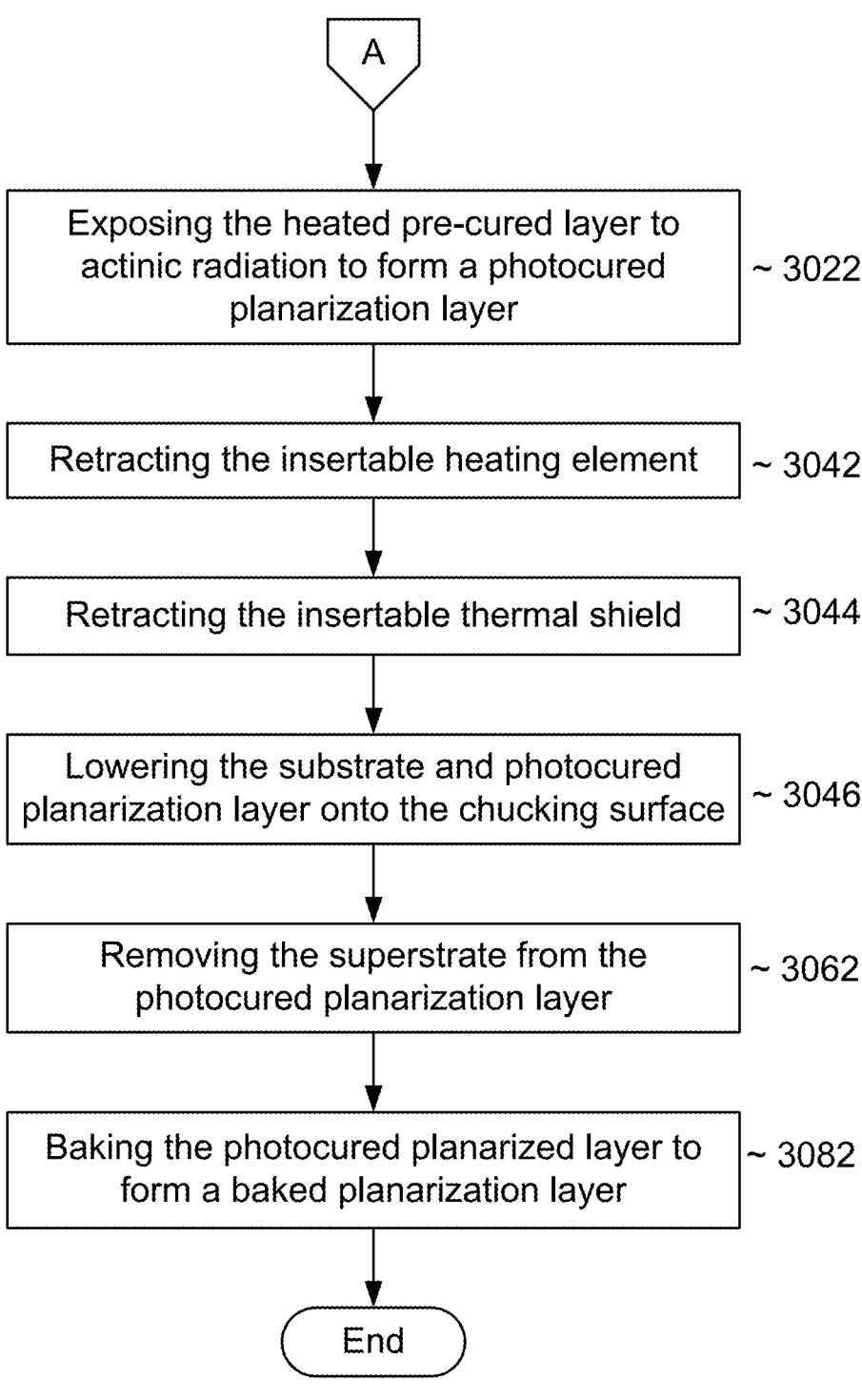

FIGS. 28 and 29 include a process flow diagram for forming a baked planarization layer from a photocurable composition.

Figure 30:
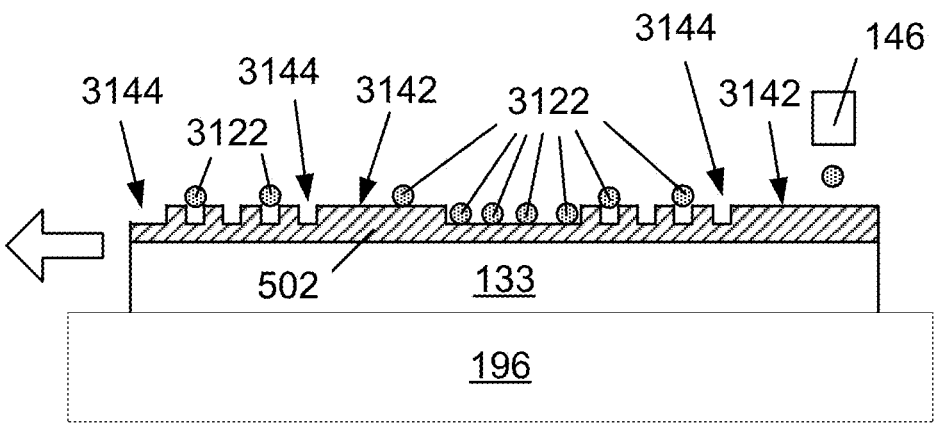

FIG. 30 includes an illustration of a cross-sectional view of a portion of a substrate chuck and a substrate when dispensing droplets of a photocurable composition over the substrate.

Figure 31:
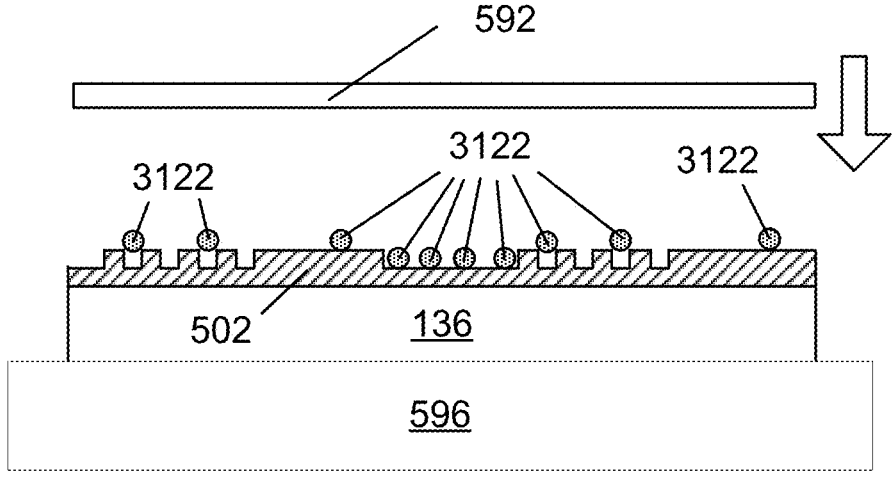

FIG. 31 includes an illustration of a cross-sectional view of the substrate chuck and substrate of FIG. 30 when a superstrate and a combination of the substrate and the droplets are being moved closer to each other.

Figure 32:
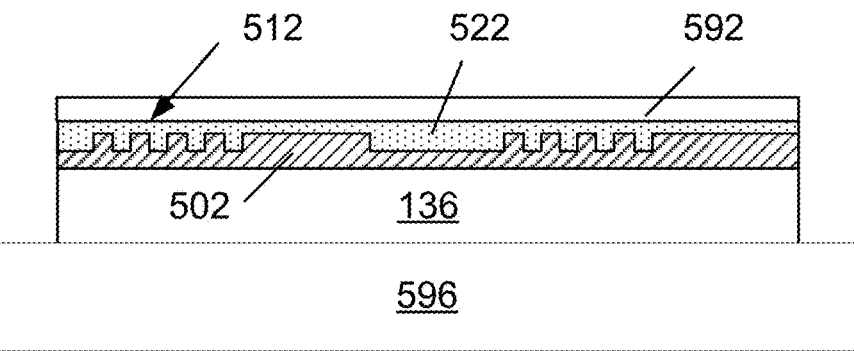

FIG. 32 includes an illustration of a cross-sectional view of the substrate chuck, substrate, and superstrate of FIG. 31 when forming a pre-cured layer of the photocurable composition.

Figure 33:
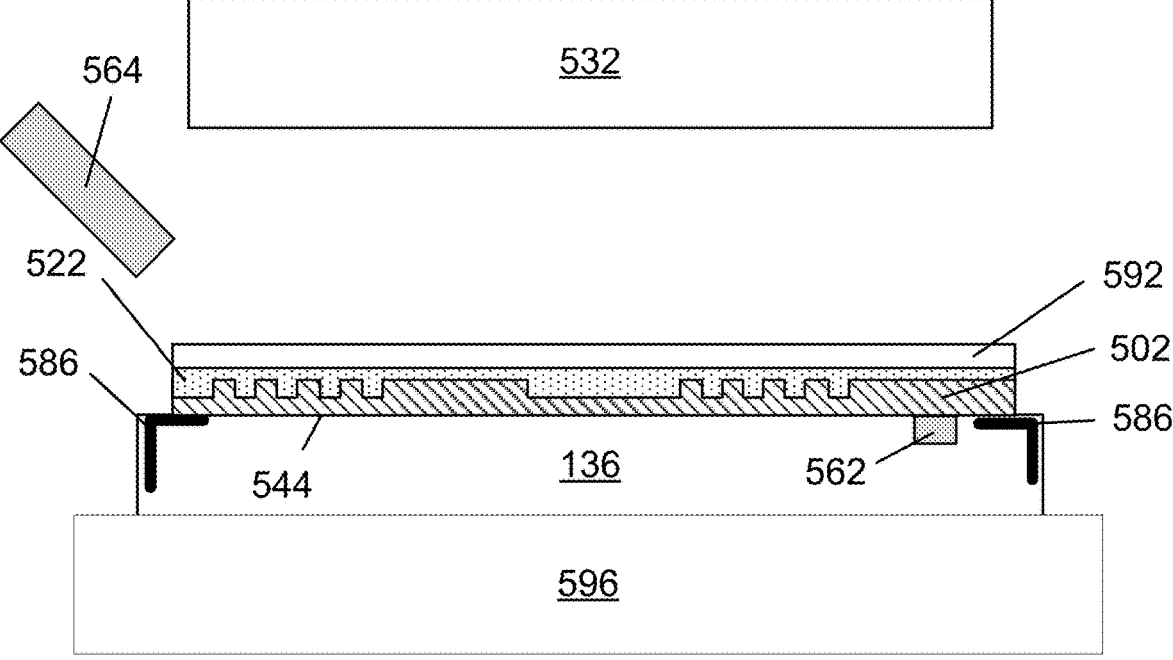

FIG. 33 includes an illustration of a cross-sectional view of a portion of the system, the substrate, and the pre-cured layer of FIG. 32 after placing the substrate and the pre-cured layer onto the substrate chuck.

Figure 34:
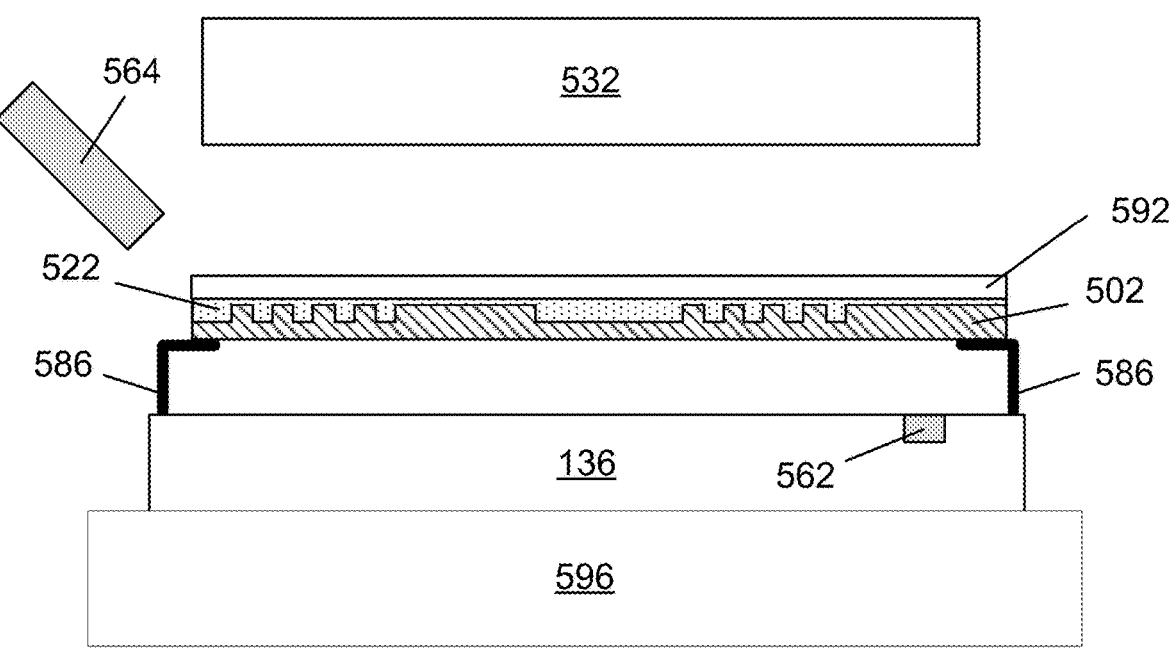

FIG. 34 includes an illustration of a cross-sectional view of a portion of the system, the substrate, and the pre-cured layer of FIG. 33 after lifting the substrate and the pre-cured layer.

Figure 35:
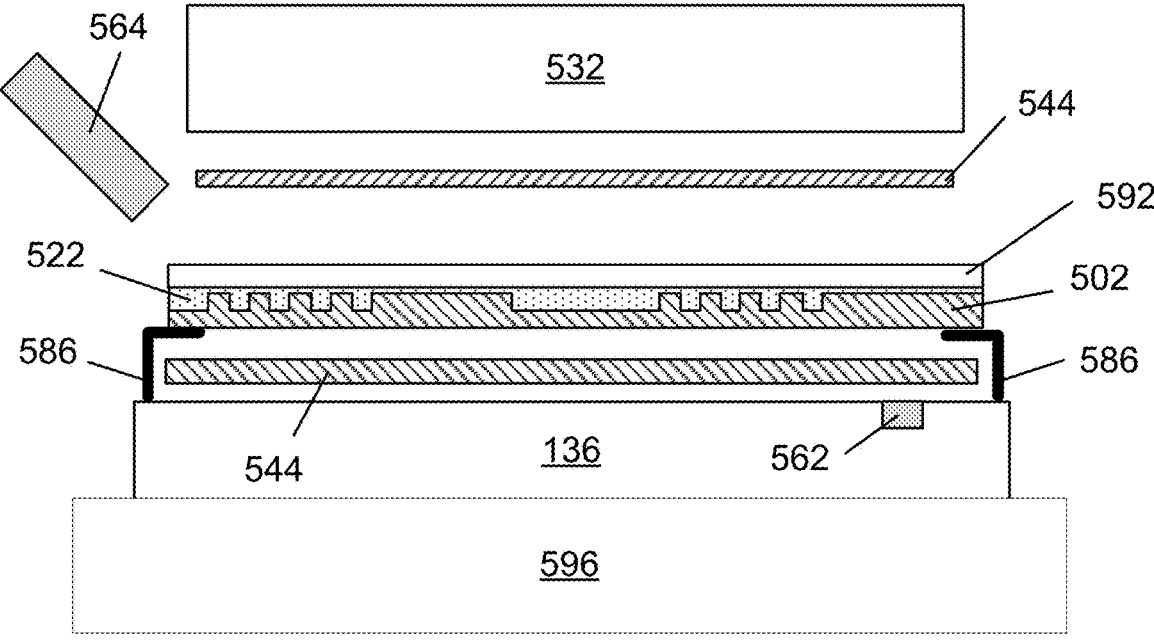

FIG. 35 includes an illustration of a cross-sectional view of a portion of the system, the substrate, and the pre-cured layer of FIG. 34 after inserting the heating member and the thermal shield.

Figure 36:
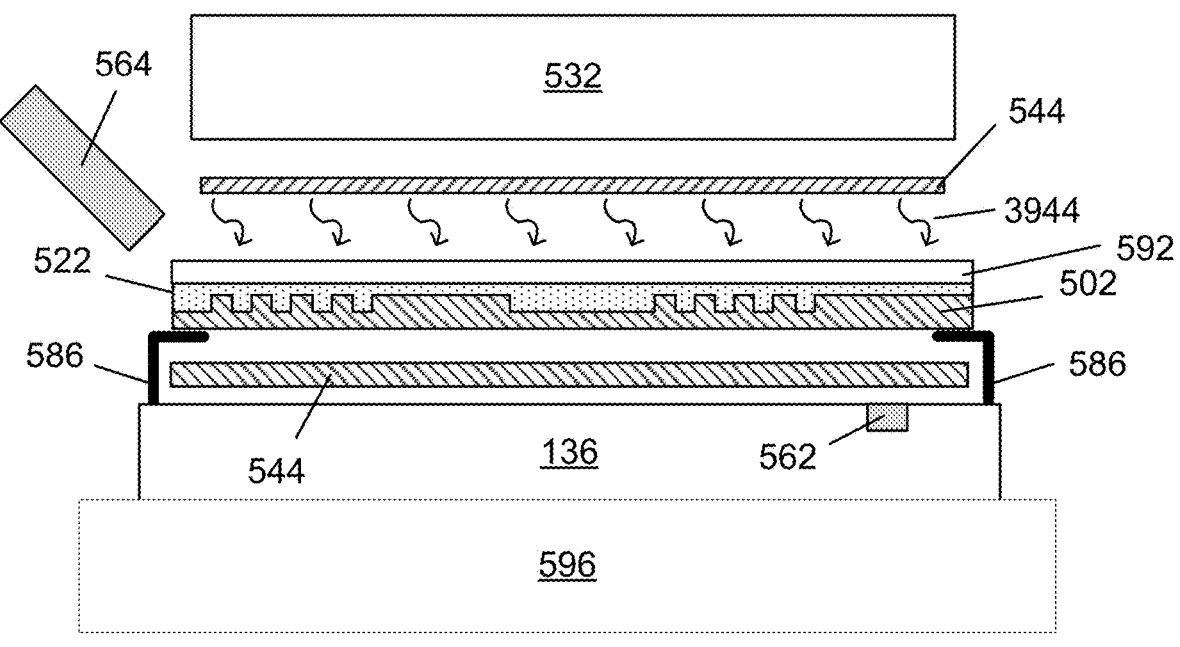

FIG. 36 includes an illustration of a cross-sectional view of a portion of the system, the substrate, and the pre-cured layer of FIG. 35 during heating the pre-cured layer.

Figure 37:
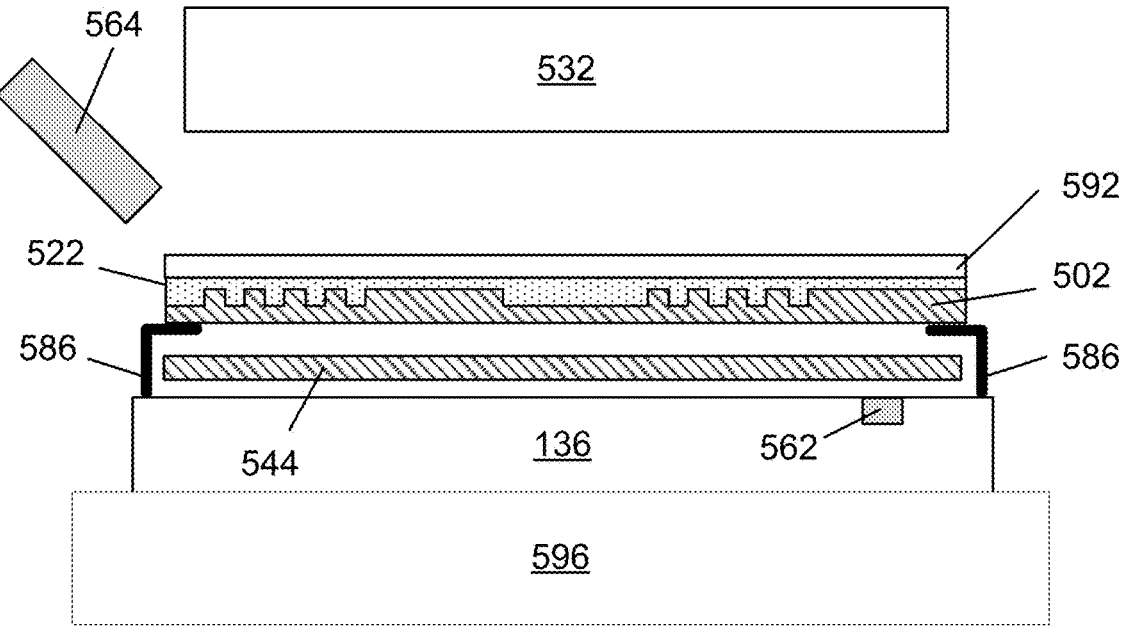

FIG. 37 includes an illustration of a cross-sectional view of a portion of the system, the substrate, and the pre-cured layer of FIG. 36 after retracting the heating member.

Figure 38:
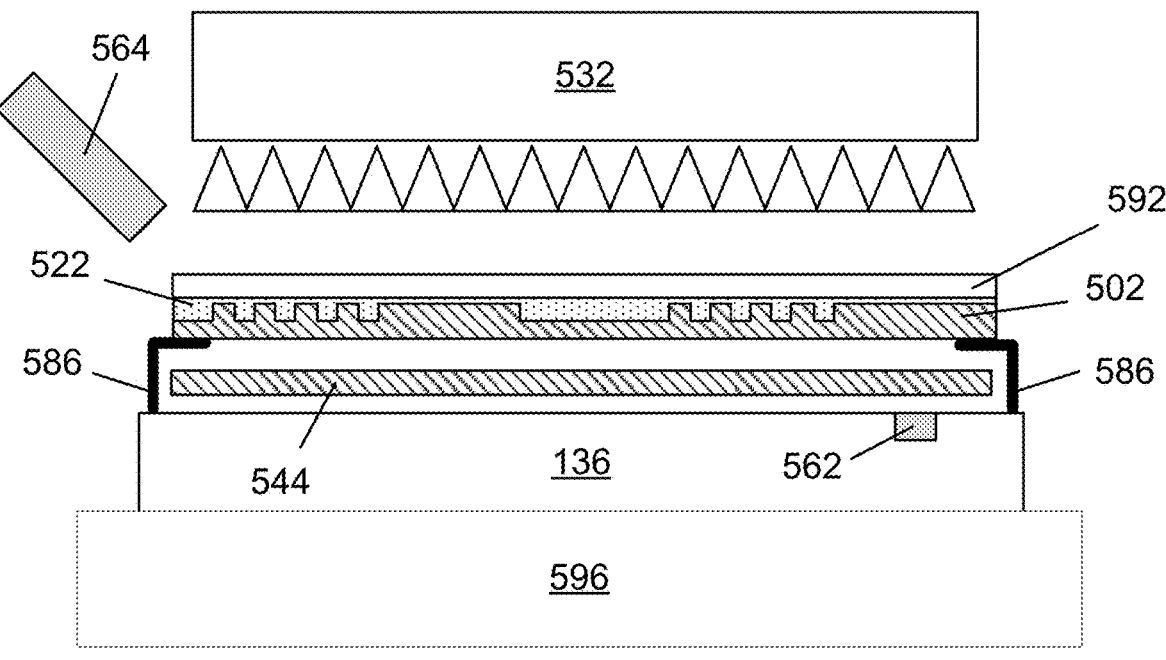

FIG. 38 includes an illustration of a cross-sectional view of a portion of the system, the substrate, and the pre-cured layer of FIG. 37 during exposure of the pre-cured layer to actinic radiation.

Figure 39:
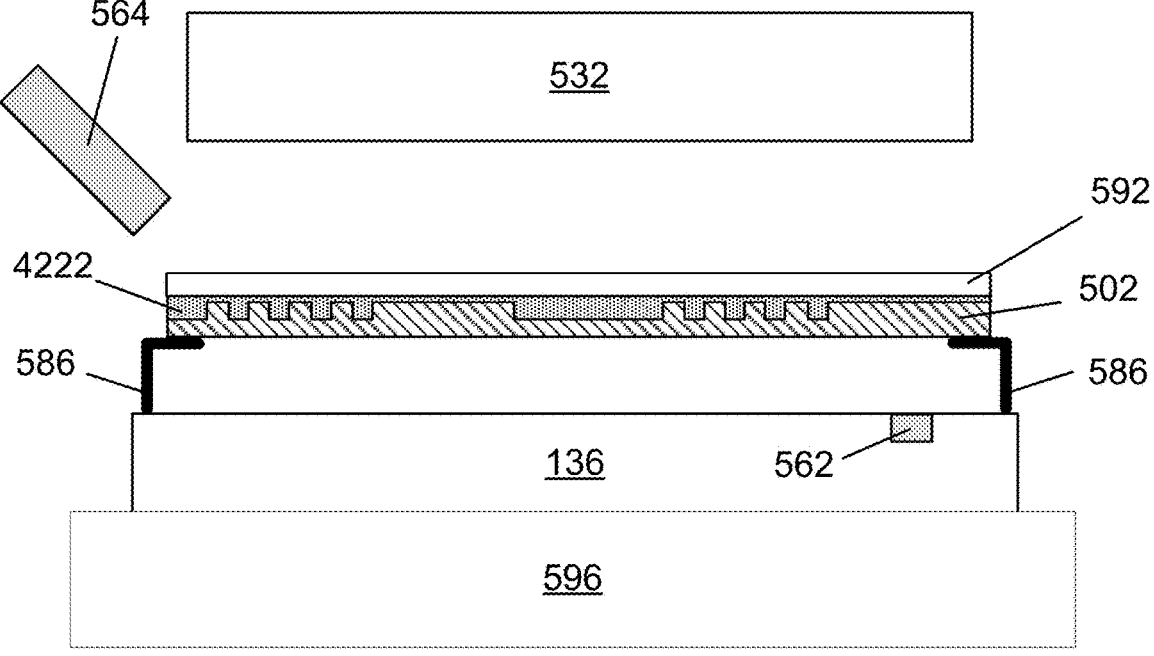

FIG. 39 includes an illustration of a cross-sectional view of a portion of the system, the substrate, and the photocured planarization layer of FIG. 38 after retracting the thermal shield.

Figure 40:
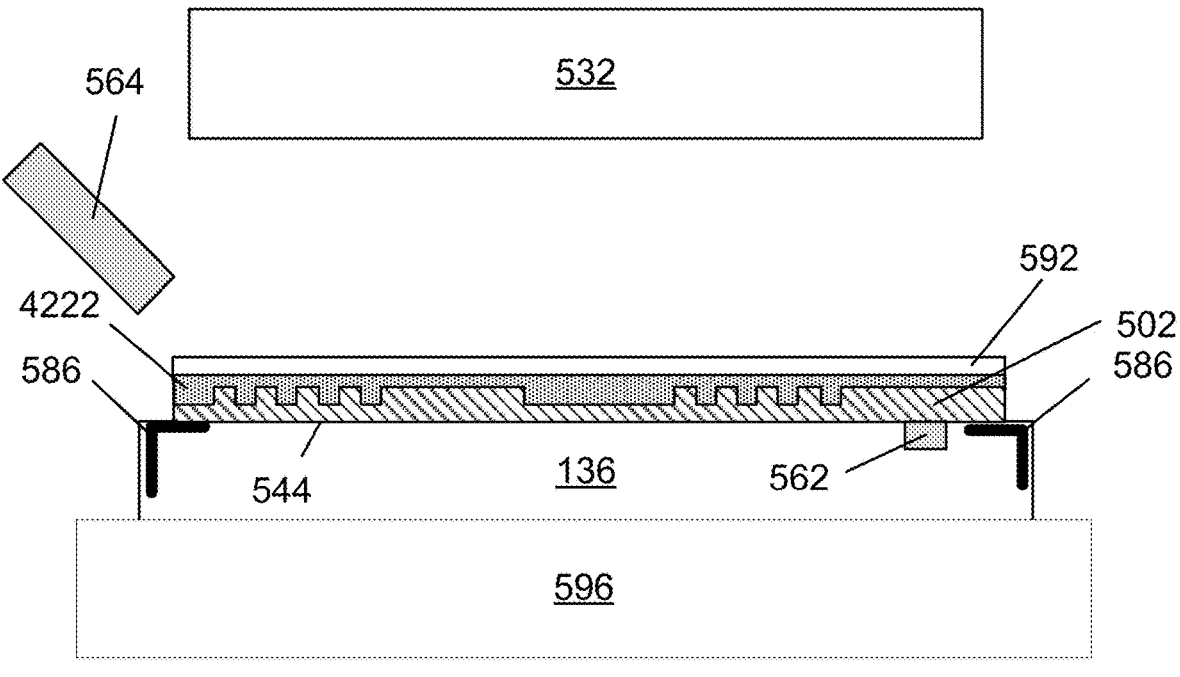

FIG. 40 includes an illustration of a cross-sectional view of a portion of the system, the substrate, and a photocured planarization layer of FIG. 39 after retracting the lift pins.

Figure 41:
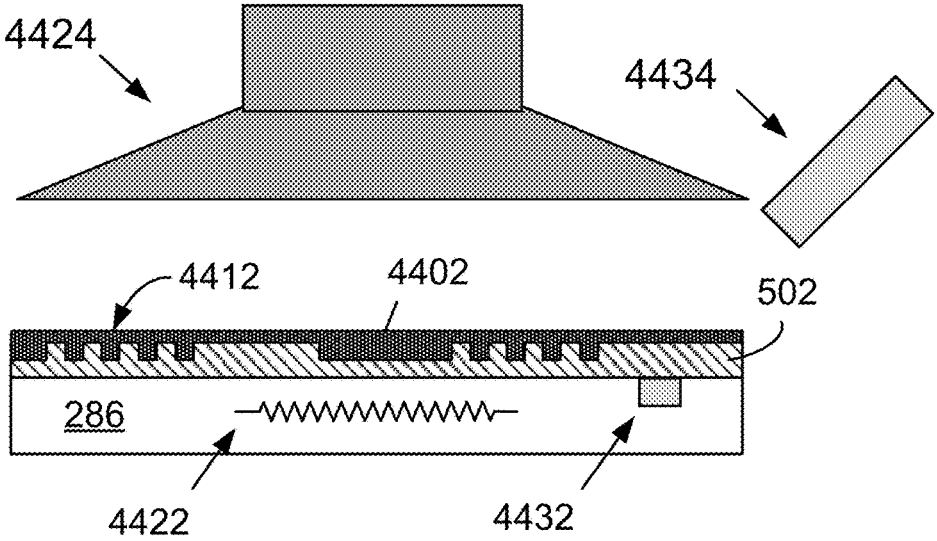

FIG. 41 includes an illustration of a cross-sectional view of a portion of the system, the substrate, and a baked planarization layer of FIG. 40 after baking the photocured planarization layer to form the baked planarization layer.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A system can include a substrate chuck, an actinic radiation source for curing a photocurable composition, an object, and a positioning device. The object can be a thermal component, such as a thermal shield or a heating member including a heating element. The positioning device can be configured to reversibly move the object between a retracted state and an inserted state. The same or different position devices can be used in moving the object between the states. When inserted, the heating element can be disposed between the substrate chuck and the actinic radiation source. When inserted, the thermal shield can be disposed between a substrate and the substrate chuck. During heating, the position of the heating member, the thermal shield, or both can help to reduce the amount of heat received by a positioning stage coupled to the substrate chuck, the substrate chuck, or both.

The positioning stage, the substrate chuck, or both may be sensitive to heat emitted by the heating element. The system can help reduce drift of any moving parts within the positioning stage, the substrate chuck, or both, where the drift is caused by temperatures above room temperature. Further, the system can help to reduce bending, warping, or otherwise disfiguring any one or more components of the positioning stage and the substrate stage from repeated heating and cooling. In an implementation, an insertable heating member, an insertable thermal shield, or both may allow a substrate to be placed more easily into or removed from the station by a substrate transfer tool as compared to a heating member, a thermal shield, or both being in a fixed position. Thus, the vertical (Z-direction) dimension of the station where heating is performed may be reduced, the operational specification regarding positioning of a robot arm, a robot hand, or both of a substrate transfer tool may be relaxed (wider allowable tolerance).

Figures 1, 2:
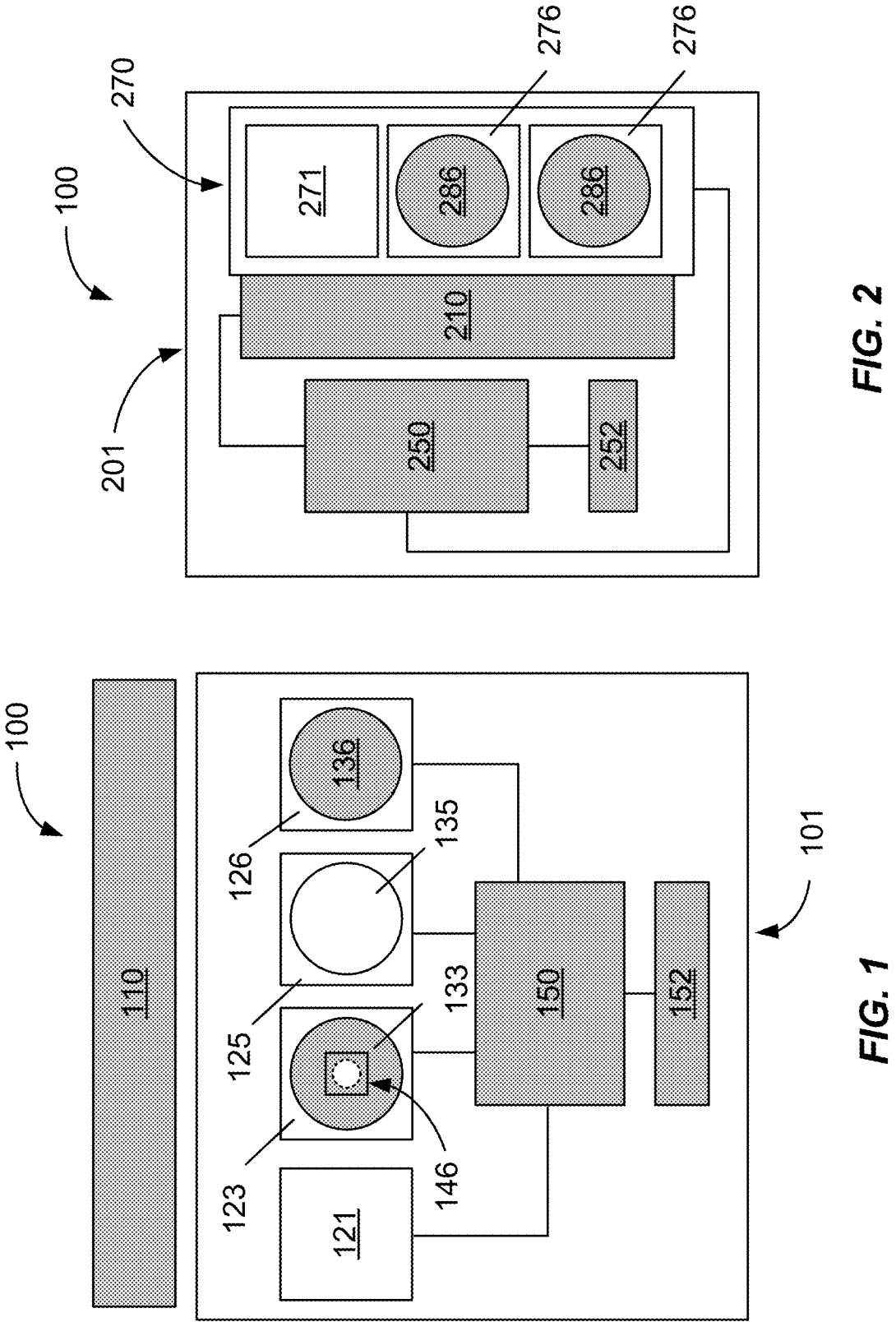
FIG. 1 includes a conceptual view of a portion of a system that can be used in forming a photocured planarization layer from a photocurable composition.
FIG. 2 includes a conceptual view of another portion of the system of FIG. 1 including post-exposure bake stations.

A system 100 illustrated in FIGS. 1 and 2 can be used. The system is well suited for an IAP process. After reading this specification, skilled artisans will be able to determine the number of apparatuses and their corresponding operations when designing a system.

FIGS. 1 and 2 include a conceptual diagram of a system 100 that can be used to form a baked planarization layer from a photocurable composition. The system 100 can include a cure apparatus 101 and a post-exposure bake apparatus 201 that can be used to bake the photocured planarization layer into a baked planarization layer. The photocurable composition will be mostly cured before baking. Some curing may occur during the post-exposure baking operation.

The cure apparatus 101 includes a substrate pod 121, a dispense station 123, a planarization head station 125, a heated radiation exposure station 126, a controller 150, and a memory 152. The dispense station 123 can include a substrate chuck 133 that can be coupled to a positioning stage (not illustrated) that allows the substrate chuck 133 to move during a dispensing operation. Another positioning stage can be used to move a substrate chuck 136 between any of the stations 125 and 126. The bake apparatus 201 in FIG. 2 can include a substrate transfer tool 210, a bake unit 270, a controller 250, and a memory 252. The bake unit 270 can include a substrate pod 271 and one or more bake stations 276 that each include a substrate chuck 286.

Many of previously-mentioned components are described below with respect to the functions that each performs. More details regarding operation of the components, and particularly the stations 123, 125, 126 and 276, are described in more detail later in this specification with respect to methods of using the systems.

The substrate transfer tool 110 can be configured to transfer a substrate to or from any of the substrate pod 121, the dispense station 123, the planarization head station 125, the heated radiation exposure station 126, and the substrate pod 121. The substrate transfer tool 210 can be configured to transfer one or more substrates to or from any of the substrate pod 271 and the bake stations 276. The substrate transfer tools 110 and 210 may be or include one or more components of an Equipment Front End Module (EFEM). The components of the EFEM can include one or more of each of the following: a robot arm, a robot hand adapted for holding substrates, a sensor, a motor for moving the robot arm, another motor for moving the robot arm, and the like. The robot arm can be configured to move the substrate with or without a layer between stations, for example, to or from the dispense station 123, the planarization head station 125, the heated radiation exposure station 126. The substrate transfer tool 210 in FIG. 2 can be identical to or different from the substrate transfer tool 110 in FIG. 1.

Referring to FIGS. 1 and 2, the substrate pods 121, and 271 can hold a plurality of substrates. An example of a substrate pod is a Front Opening Unified Pod (FOUP) which is defined by industry standards (for example SEMI E47.1-1106, 2012) as a pod for storing and transporting substrates. The systems described herein include coupling plates, interface holes, and load ports for receiving and transferring substrates to and from 1 to 4 substrate pods. A substrate can be removed from the substrate pod 121, processed at stations of the system 100, such as the stations 123, 125, 126, or a combination thereof, and moved to the substrate pod 121 or another substrate pod when processing in the portion of the system 100 illustrated in FIG. 1 is completed. A substrate can be removed from the substrate pod 271, processed at one or more of the bake stations 276, and returned to the substrate pod 271 or another substrate pod when baking is completed.

The dispense station 123 can be configured to receive a substrate and dispense a photocurable composition over the substrate. When the substrate is over the substrate chuck 133, a dispense head 146 can be used to dispense a photocurable composition over the substrate. A positioning stage (not illustrated in FIG. 1) can be coupled to the substrate chuck 133 and be configured to move during a dispense operation. The dispense head 146 can include one or more nozzles that dispense the photocurable composition. The dashed line within the dispense head 146 is used to indicate that the photocurable composition is dispensed along the bottom side of the dispense head 146. A positioning stage coupled to the substrate chuck 133, the dispense head 146, or both can be configured to move when dispensing the photocurable composition. More details regarding the photocurable composition and methods of dispensing and processing the photocurable composition are described later in this specification. The substrate transfer tool 110 can transfer the substrate and the photocurable composition overlying the substrate from the dispense station 123 to the substrate chuck 136 after a different positioning stage (not illustrated in FIG. 1) coupled to the substrate chuck 136 is moved to planarization head station 125.

The planarization head station 125 can include a planarization head 135 that is configured to place a superstrate in contact with the photocurable composition. The superstrate can be placed in contact with droplets of the photocurable composition causing droplets of the photocurable composition to coalesce and form a pre-cured layer of the photocurable composition. In an implementation, the planarization head 135 can be configured to remove the superstrate after the photocurable composition is sufficiently cured. FIG. 1 illustrates one planarization head station 125. In another implementation, a plurality of planarization head stations identical to the planarization head station 125 can be used. The positioning stage coupled to the substrate chuck 133 can transfer the substrate and the pre-cured layer of the photocurable composition overlying the substrate from the planarization head station 125 to the heated radiation exposure station 126. In an alternative implementation, a positioning stage can be shared by the stations 123, 125, and 126, rather than having two different positioning stages.

The heated radiation exposure station 126 can be configured to photocure the photocurable composition. A pre-cured layer of the photocurable composition can be exposed to actinic radiation when the pre-cured layer is at an elevated temperature above the ambient temperature. Ambient temperature is the temperature of the room in which a station within an apparatus is located. Thus, the ambient temperature can be the room temperature. For example, the ambient temperature may be in a range from 20° C. to 25° C. The actinic radiation can cause a polymerizable material within the photocurable composition to polymerize and form the photocured planarization layer. The photocured planarization layer may be further cured at an optional curing station with or without the superstrate before being baked.

The positioning stage shared by the stations 125 and 126 can move the substrate chuck, the substrate and the photocured planarization layer from the heated radiation exposure station 126 to the planarization head station 125 where the superstrate can be removed after the radiation exposure operation in the heated radiation exposure station 126 is completed.

The heated radiation exposure stations 126 can be configured to perform two operations. The heated radiation exposure stations 126 can be configured to heat the pre-cured layer and expose the pre-cured layer to actinic radiation to form a photocured planarization layer. Heating the substrate and pre-cured layer can be performed before or before and during exposure to actinic radiation within the heated radiation exposure station 126 to form the photocured planarization layer. In another implementation, the heating and exposing to actinic radiation can be performed in two different stations when the heating is completed before the exposing to actinic radiation. Sufficient thermal shielding may be used to help keep heat from the heated radiation exposure stations 126 from adversely affecting operation of another portion of the system 100, such as the positioning stage used for the planarization head station 125.

Heating means associated with the heated radiation exposure stations 126 can be activated to heat the photocurable composition. More details regarding the heating means for the heated radiation exposure stations 126 are described later in this specification. A direct temperature measurement of the pre-cured layer may be difficult to obtain. Thus, the temperature of the pre-cured layer can correspond to a different temperature within the heated radiation exposure station 126. The temperature of the pre-cured layer may be correlated to the temperature of its corresponding substrate chuck 136, the substrate overlying such substrate chuck 136, or a superstrate in contact with the pre-cured layer. A user of the system 100 may control operations using the temperature of the substrate chuck 136, the substrate, or the superstrate because a direct temperature measurement of the pre-cured layer may not be practical.

When the temperature of the substrate chuck 136, the substrate, or the superstrate is at a targeted temperature or within a tolerance of such temperature, the heating means can be deactivated or be put in a holding state to keep the substrate chuck 136 or the substrate at the targeted radiation exposure temperature or within a tolerance of such temperature. The tolerance of such temperature can be +/−5° C., 2° C., 1° C., or 0.5° C. of the targeted temperature. The targeted temperature may be the same or different from a desired radiation exposure temperature when exposing the pre-cured layer to actinic radiation. The targeted temperature can be determined after a desired radiation exposure temperature is known. More details regarding the targeted temperature are described with respect to methods of using the system 100.

When the pre-cured layer is at the radiation exposure temperature, the pre-cured layer can be exposed to actinic radiation to form a photocured planarization layer. The actinic radiation can cause a polymerizable material within the photocurable composition to polymerize. The photo- cured planarization layer refers to the layer of the polym- erized photocurable composition after the pre-cured layer of the photocurable composition is photocured using actinic radiation and before the layer of polymerized photocurable composition is further processed by optional further curing and during a post-exposure baking operation.

If needed or desired, an additional radiation exposure station (not illustrated) can be added to the system to partly cure the pre-cured layer before processing in the heated radiation exposure station 126 is performed. The room temperature cure may be performed for a time period that is substantially less than the time period for the heated radia- tion exposure. The additional radiation exposure station may help improve system throughput.

FIG. 1 illustrates the heated radiation exposure station 126. In practice, more than one heated radiation exposure station can be used. When a plurality of heated radiation exposure stations 126 is used, the organization of the heated radiation exposure stations 126 can be planar where heated radiation exposure stations 126 lie along a single plane, may be stacked, or a combination of heated radiation exposure stations 126 lying along a single plane and another combi- nation of heated radiation exposure stations 126 being stacked. Stacking the heated radiation exposure stations 126 can help to reduce the area occupied by the stations 126. The number of heated radiation exposure stations 126 within a stack can be 2 or more. Due to height constraints within a room where the stations 126 are located and the height of each heated radiation exposure stations, the number of heated radiation exposure stations 126 within a stack may be limited to 9 stations, 7 stations, or 5 stations. The number of stacks can be 1 or more. The number of stacks may be limited by available floor space within the room in which the cure unit is located. The number of stacks of heated radiation exposure stations 126 may be limited to 9 stacks, 7 stacks, or 5 stacks.

FIG. 1 illustrates the planarization head station 125. In practice, more than one planarization head station can be used. In a non-limiting implementation, a ratio of planar- ization head stations to heated radiation exposure stations can be 1:1. In another implementation, the ratio may be lower (relatively fewer planarization head stations) or higher (relatively more planarization head stations).

Referring to FIG. 2, the post-exposure bake unit 270 can include the substrate pod 271 and post-exposure bake sta- tions 276 that include substrate chucks 286. The post- exposure bake stations 276 can further polymerize or cross- link the photocurable composition within the photocured planarization layer due to thermal curing, cause a different reaction of a component within the photocurable composi- tion, drive out a volatile component within the photocurable composition, or the like. The post-exposure bake stations 276 can have any of the designs, including the heating means, as described with respect to the heated radiation exposure stations 126. The heating means for the post- exposure bake stations 276 can be the same or different from the heat means for the heated radiation exposure stations 126. In an implementation, the post-exposure bake stations 276 can include a heating means configured to operate at a higher temperature as compared to the heated radiation exposure stations 126. The temperature used for post-expo- sure baking may be at least 300° C. The highest processing temperature associated with the post-exposure bake stations 276 may be as high as 500° C.

The previously described operation performed by any particular station may be moved or combined with another station. For example, the dispensing of the photocurable composition and placement and removal of the superstrate can be performed within the same station. For example, the placement and removal of the superstrate may be performed using a planarization head when present within any of the stations 123 and 126. Thus, the planarization head station 125 is not required in all implementations. In another configuration, operations performed by one station may be performed in separate stations. For example, heating the pre-cured layer may be performed in one station, and exposure of the heated pre-cured layer to actinic radiation may be performed in a different station.

Each of the substrate chucks 133, 136, and 286 can be a vacuum chuck, a pin-type chuck, a groove-type chuck, an electrostatic chuck, an electromagnetic chuck, or the like. The substrate chucks 133, 136, and 286 may be the same type, for example, vacuum chucks, or may be different types. For example, one of the substrate chucks can be a vacuum chuck, and another one of the substrate chucks can be an electrostatic or electromagnetic chuck. Each of the substrate chucks 133, 136, and 286 may or may not have a heating element, a cooling element, or both that can be used to heat or cool a substrate and a layer, and if present, a superstrate overlying the substrate. More details on designs of the substrate chucks are described later in this specification.

The controller 150 is coupled to the memory 152 and can control components within the cure apparatus 101, and the controller 250 is coupled to the memory 252 and can control components within the bake apparatus 201. The controller 150 and the memory 152 are described in more detail below. The description of the controller 150 can apply to the controller 250 and the description of the memory 152 can apply to the memory 252 except as noted when addressing specific details of the system 100.

If needed or desired, any combination of the controllers 150 and 250 can communicate with each other. For example, one or both controllers 150 and 250 can be used to confirm that a particular lot of substrates with photocured planariza- tion layers at the substrate pod 271 have completed process- ing within the cure apparatus 101 before the substrates and photocured planarization layers are baked at a post-exposure bake station 276 in the bake unit 270.

The controller 150 and 250 can operate using a computer readable program, optionally stored in memory 152 or 252. Either or both of the controllers 150 and 250 can include a processor (for example, a central processing unit of a microprocessor or microcontroller), a field-programmable gate array (FPGA), an application specific integrated circuit (ASIC), or the like. Either or both of the controllers 150 and 250 can further include internal memory, such as a set of registers, a cache memory, a flash memory, or the like. The controllers 150 and 250 can be within the system 100. In another implementation (not illustrated) of the system, one or both of the controllers 150 and 250 can be at least part of a computer external to the system 100, where such computer is bidirectionally coupled to the system 100.

Any or all of the memories 152 and 252 can include a non-transitory computer readable medium that includes instructions to carry out the actions associated with or between operations. Either or both of the memories 152 and 252 can include a set of registers, a cache memory, a flash memory, a hard drive, or the like. Either or both of the memories 152 and 252 can further include data tables that can be accessed by either or both of the controllers 150 and 250 to assist in determining an operating parameter, for example, a local areal density of the photocurable composition to be dispensed, a targeted temperature, a radiation exposure temperature, a dose of actinic radiation during one or more radiation exposure operations, a total dose of actinic radiation received by a photocurable composition for all radiation exposure operations, a post-exposure baking temperature, or another parameter used in the methods as described below. As used herein, the total dose is a sum of the doses used in exposing a photocurable composition to actinic radiation. In an implementation, the total dose can be the sum of a dose used in forming a photocured planarization layer and another dose used in an optional curing process. The controller can select the targeted temperature associated with the heated radiation exposure based on the post-exposure baking temperature stored in memory.

In another implementation, one or more components, such as the stations 123, 125, 126, and 276, of the system 100 can include a local controller that provides some of the functionality that would otherwise be provided by the controller 150 or 250.

More or fewer controllers and more or fewer memories may be used with respect to the system 100. In another implementation, a single controller can perform all of the functions described with respect to the controllers 150 and 250. Thus, one controller, rather than two controllers, may be used with the system 100. In a further implementation, the controller 150 may control the cure apparatus 101 and the bake apparatus 201, and thus the controller 250 is not required, or the controller 250 may control the cure apparatus 101 and the bake apparatus 201, and thus the controller 150 is not required. In another implementation, a single memory, rather than two memories, may be used with the system 100.

In another implementation, the heated radiation exposure station 126 can be in a different apparatus as compared to the dispense station 123. The planarization head station 125 may be located in the apparatus that includes the heated radiation exposure station 126 or the dispense station 123.

Figure 3:
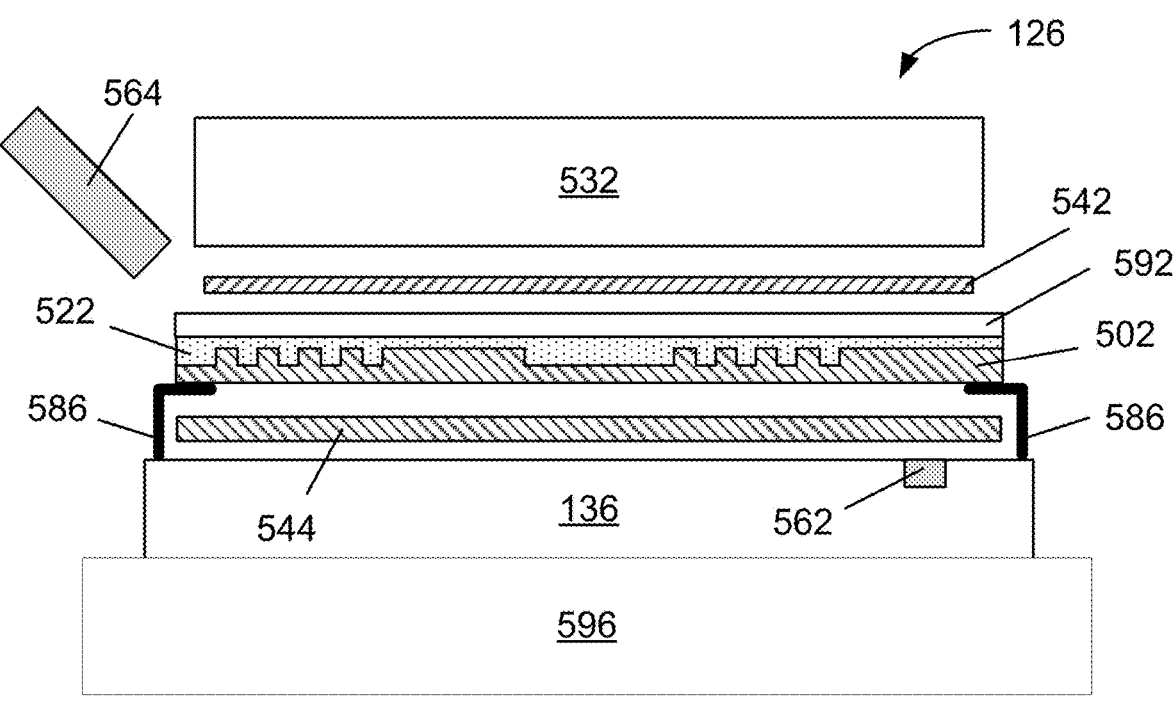
FIG. 3 includes a cross-sectional view of a portion of a station that includes an insertable heating member and an insertable thermal shield.

FIG. 3 includes a cross-sectional view of a portion of the system 100 that includes one of the heated radiation exposure stations 126. The substrate chuck 136 is coupled to a positioning stage 596 and includes lift pins 586. As illustrated in FIG. 3, the lift pins 586 are in an extended state and are supporting a substrate 502 and a pre-cured layer 522 of a photocurable composition and a superstrate 592. When the lift pins 586 are in a retracted state, the uppermost surfaces of the lift pins 586 can be at an elevation along or below a chucking surface (upper surface in FIG. 3) of the substrate chuck 136. The lift pins can support the substrate 502, the pre-cured layer 522, and the superstrate 592, and the positioning stage 596 is used to move the substrate chuck 136 between the heated radiation exposure station 126 and the planarization head station 125. The positioning stage 596 can also be used to precisely position the substrate chuck 136 relative to the planarization head 135.

The heated radiation exposure station 126 further includes a radiation source 532. In an implementation, the radiation source can include one or more lamps, light emitting diodes (LEDs), or lasers that can emit actinic radiation having a wavelength of at least 10 nm and less than 700 nm. The actinic radiation can be ultraviolet radiation having a wavelength in a range from 100 nm to 400 nm, and more particularly, in a range from 200 nm to 400 nm. A supplier of the photocurable composition may provide a targeted wavelength or a targeted range of wavelengths to be used to photocure the photocurable composition.

The radiation exposure station 126 can further include a heating member 542 and a thermal shield 544. The heating member 542 can include a heating element. As used herein, a heating element is a portion of a heating member that emits heat, wherein the heating element is a combination of a structure that emits the heat and a supporting material upon which the structure physically contacts or in which the structure is embedded. The heating element may or may not have a shape that corresponds to the substrate 502. In an implementation, the heating member 542 can be an insertable heating member that can be inserted above the pre-cured layer 522 and used to heat the pre-cured layer 522 before or during exposure to actinic radiation. When in an inserted state, the heating element is disposed between the substrate chuck 136 and the actinic radiation source 532, and in a retracted state, the heating element is not disposed between the substrate chuck 136 and the actinic radiation source 532. Thus, the heating member 542 can be reversibly moved between an inserted state and a retracted state. The heating member 542 can be in an inserted state when the heating element is in an activated state and in a retracted state when the heating element is in a deactivated state. More details regarding the heating member 542, including the heating element, and the heating member's supporting mechanical equipment is described later in this specification.

In an implementation, the thermal shield 544 can be an insertable thermal shield that can be inserted between the substrate 502 and the substrate chuck 136. When in an inserted state, the thermal shield 544 is disposed between the substrate chuck 136 and the actinic radiation source 532, and in a retracted state, the thermal shield 544 is not disposed between the substrate chuck 136 and the actinic radiation source 532. Thus, the thermal shield 544 can be reversibly moved between an inserted state and a retracted state. The thermal shield 544 can help reduce the amount of heat that can reach a temperature-sensitive component of the radiation exposure station 126. The positioning stage 596, the substrate chuck 136, or both may include positioning or other mechanisms that are designed to move to precise locations. Over time, exposure to heat or repeated heating and cooling cycles may cause the positioning or other mechanisms to drift and require recalibration or may cause a feature within the positioning stage 596, the substrate chuck 136, or both to become warped, distorted, or otherwise change in shape.

From a top view (illustrated in subsequent figures), a thermal shield can include a chuck portion that has a shape that corresponds to a shape defined by the periphery of a substrate. For example, the chuck portion and the substrate can be circular. The chuck portion of the thermal shield can have a width or diameter that is less than, the same as, or greater than the substrate. The thermal shield can be moved such that the thermal shield extends beyond opposite points along a peripheral edge of the substrate. In an implementation, when in an inserted state, the thermal shield can extend beyond the substrate in all directions.

The thermal shield 544 can include a material having a thermal conductivity less than 5 W/(m*K). An exemplary material for the thermal shield 544 is polymer, quartz, zirconia, yttria, cordierite, Vacuum Insulated Panel, or aerogel. The thermal shield may include a liquid cooling element and include a high thermal conductivity material such as Al or Cu. The thermal shield may include a surface that that reflects thermal radiation such as a hot mirror, a hot mirror coating, or a hot mirror polish. The thermal shield may be a multilayer system that includes one or more of: a hot mirror; a low thermal conductivity material layer; a liquid cooling layer; and a high thermal conductivity material layer. The thermal shield 544 can be in an inserted state after the substrate 502 and the pre-cured layer 522 are lifted by the lift pins 586 and in a retracted state before the lift pins 586 are in a retracted state.

The radiation exposure station 126 can further include a temperature sensor 562, a temperature sensor 564, or both temperature sensors. The temperature sensor 562 can be disposed within the substrate chuck 136. In another implementation (not illustrated in FIG. 3), the substrate 502 may be in contact with the substrate chuck 136 when the substrate 502 and pre-cured layer 522 are heated before or before and during exposure to actinic radiation. The temperature sensor 564 may be a proximity temperature sensor that can receive near infrared radiation from the substrate 502, the pre-cured layer 522, or both and determine a temperature of the substrate 502, the pre-cured layer 522, or both.

Figure 4:
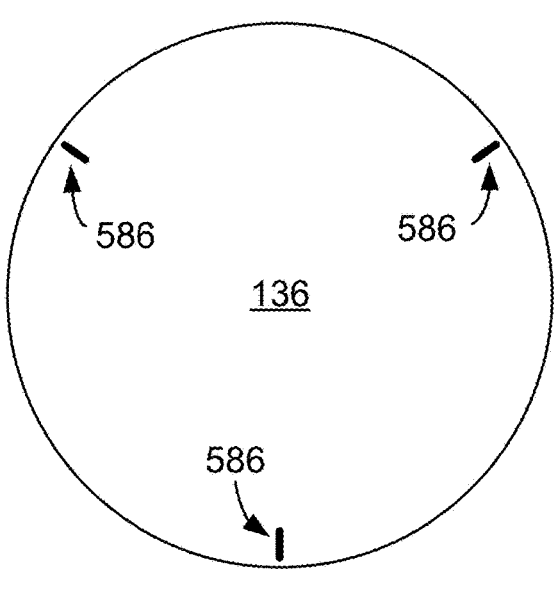
FIG. 4 includes a top view of a substrate chuck and lift pins of FIG. 3 before inserting a thermal shield.
Figure 5:
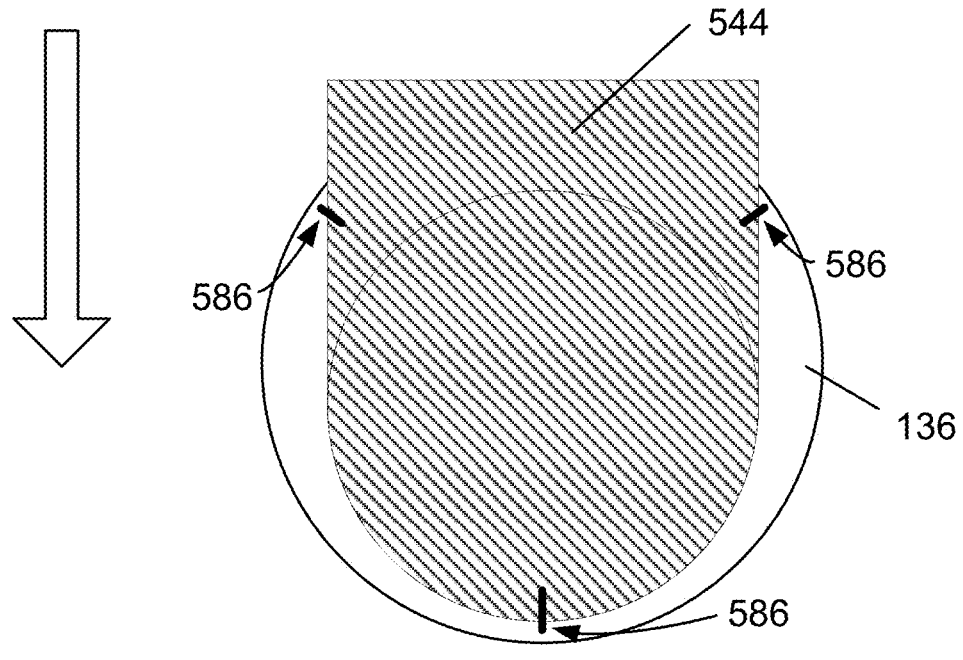
FIG. 5 includes a top view of a substrate chuck and lift pins of FIG. 4 after inserting a thermal shield.

FIGS. 4 and 5 are top views illustrating relationships between the substrate chuck 136, the lift pins 586, and the thermal shield 544. The substrate chuck 136 can include lands that define a vacuum zone for holding a substrate, a pressurization zone for modulating the substrate (such as bowing the substrate) and may or may not include stationary or lift pins (such as the lift pins 1076 described with respect to FIG. 8) within any of the zones that can help to support the substrate 502 when it is being held along a chucking surface of the substrate chuck 136 or to assist in the placement or removal of the substrate 502 within the heated radiation exposure station 126. Such lands and pins are not illustrated in FIG. 5 with respect to the heated radiation exposure station 126 to simplify understanding of relationships between other components of the system 100.

Referring to FIG. 4, the lift pins 586 are located at 60°, 180°, and 300° radial positions of the substrate chuck 136, where a 0°/360° radial position is closest to the top of FIG. 4. When the lift pins 586 are in the extended state, the thermal shield 544 can pass under portions of the lift pins 586. The substrate chuck can also include widely-spaced lift pins arranged at 90° and 270° to allow for a wider thermal shield to be inserted between the lift pins and allow for simpler design of the lift pins (not shown). The thermal shield 544 is inserted over the substrate chuck 136 from a direction corresponding to the top of FIG. 5 and is illustrated by the arrow in FIG. 5.

Figure 6:
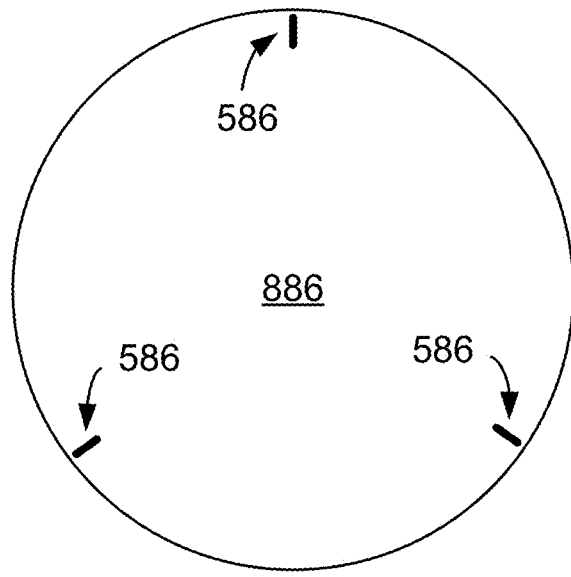
FIG. 6 includes a top view of a substrate chuck and lift pins in accordance with another implementation before inserting a thermal shield.
Figure 7:
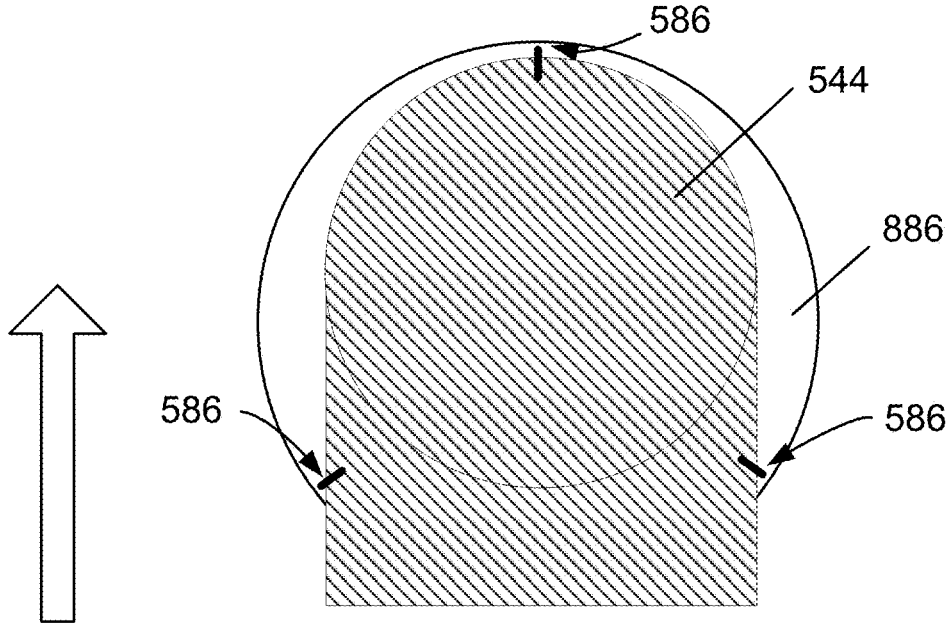
FIG. 7 includes a top view of a substrate chuck and lift pins of FIG. 6 after inserting a thermal shield.

FIGS. 6 and 7 are top views illustrating relationships between a substrate chuck 886, the lift pins 586, and the thermal shield 544. The substrate chuck 886 is identical to the substrate chuck 136 except that the lift pins 586 are located at 0°/360°, 120°, and 240° radial positions of the substrate chuck 886 where the 0°/360° radial position is closest to the top of FIG. 6. When the lift pins 586 are in the extended state, the thermal shield 544 can pass under portions of the lift pins 586. The thermal shield 544 is inserted over the substrate chuck 886 from a direction corresponding to the bottom of FIG. 7 and is illustrated by the arrow in FIG. 7.

The lift pins 586 can be referred to offset lift pins each having a vertical portion and a substrate contacting portion that extends from the vertical portion toward a location farther from the periphery of the substrate chuck 136 or 886. The thermal shield 544 is not disposed directly over or directly under the vertical portions of the lift pins 586 when the thermal shield 544 is in the inserted state. Directly overlie and directly underlie refers to at least portions of components or other features that lie along a vertical line that is perpendicular to a plane defined by a chucking surface of a substrate chuck. Components or features that directly overlie or directly underlie each other may or may not be in physical contact with each other.

Offset lift pins are not required in all implementations. As illustrated in top views in FIGS. 8 to 11, lift pins 1076 can be used. The lift pins 1076 have vertical shafts and may or may not be rounded along the upper surface that contacts a substrate. As illustrated, the lift pins 1076 do not include the substrate contacting portions as described with respect to the lift pins 586, and thus, the thermal shield does not pass under portions of the lift pins 1076. The lift pins 1076 can be located closer to the center of the substrate chuck 1086 (FIG. 8) or the substrate chuck 1286 (FIG. 10) as compared to the lift pins 586 as illustrated in FIGS. 4 to 7.

Figure 8:
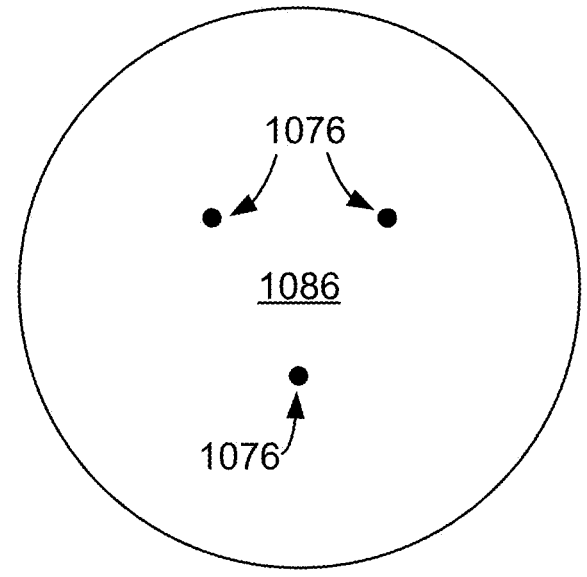
FIG. 8 includes a top view of a substrate chuck and lift pins in accordance with a further implementation before inserting a thermal shield.
Figure 9:
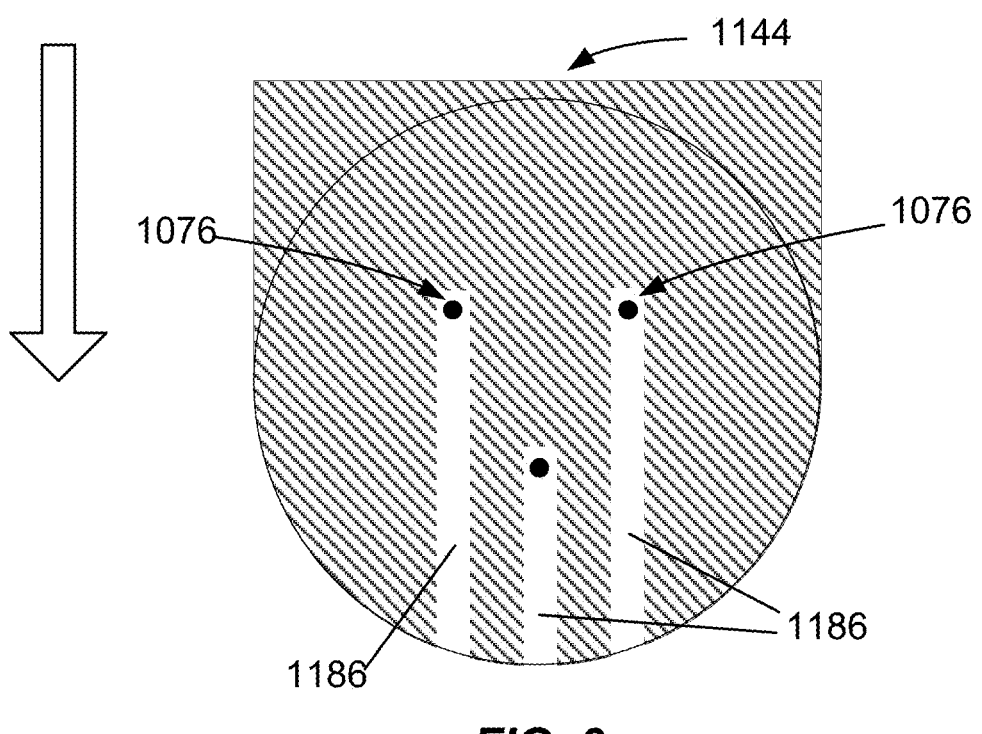
FIG. 9 includes a top view of a substrate chuck and lift pins of FIG. 8 after inserting a thermal shield.

Referring to FIGS. 8 and 9, the lift pins 1076 are located at 60°, 180°, and 300° radial positions with respect to the substrate chuck 1086, where the 0°/360° radial position is closest to the top of FIG. 8. A thermal shield 1144 can have any of the materials and designs as described with respect the thermal shield 544 except the thermal shield 1144 includes slots 1186 so that the thermal shield 1144 can be inserted around the lift pins 1076. Portions of the substrate chuck 1086 or an underlying positioning stage may be exposed under the slots 1186. The thermal shield 1144 is inserted over the substrate chuck 1086 from a direction corresponding to the top of FIG. 9 and is illustrated by the arrow in FIG. 9.

Referring to FIGS. 10 and 11, the lift pins 1076 are located at 120°, 240°, and 0°/360° radial positions of the substrate chuck 1286 where the 0°/360° position is closest to the top of FIG. 10. A thermal shield 1344 can have any of the materials and designs as described with respect the thermal shield 544 except the thermal shield 1344 includes slots 1386 so that the thermal shield 1344 can be inserted around the lift pins 1076. Portions of the substrate chuck 1086 or an underlying positioning stage may be exposed under the slots 1386. The thermal shield 1344 is inserted over the substrate chuck 1086 from a direction corresponding to the top of FIG. 11 and is illustrated by the arrow in FIG. 11. FIG. 12 is an illustration of a thermal shield 4544 that includes two slots 4586 that can be inserted around the three lift pins 1076. The thermal shield 4544 can have any of the materials and designs as described with respect the thermal shield 544 except the thermal shield 4544 includes the slots 4586 so that the thermal shield 4544 can be inserted around the lift pins 1076.

In alternative implementations, the thermal shield 1144 in FIG. 9 can be used with respect to the substrate chuck 1286 in FIG. 10, and the thermal shield 1344 in FIG. 11 can be used with the substrate chuck 1086 in FIG. 8. From a top view, the thermal shield 1344 can be rotated 180° and inserted over the substrate chuck 1086 from a direction corresponding to the bottom of FIG. 8. Similarly, from a top view, the thermal shield 1144 can be rotated 180° and inserted over the substrate chuck 1286 from a direction corresponding to the bottom of FIG. 10.

The thermal shield can be formed of or formed from a single piece of material. In a further implementation, a thermal shield 1444 can include an upper layer 14442 and a lower layer 14444 as illustrated in FIG. 12. The lower layer 14444 has a relatively lower thermal conductivity and can include any of the materials and designs as previously described with respect to the thermal shields 544, 1144, and 1344. The upper layer 14442 can include a material that has a relatively higher thermal conductivity as compared to the lower layer 14444. The thermal conductivity of the upper layer 14442 can be at least 5 W/(m*K) or at least 11 W/(m*K). An exemplary material of the upper layer 14442 can include an elemental metal (a metal that is not part of an alloy or compound; an elemental metal can be Al, Cu, etc.), a metal alloy (such as stainless steel), AlN, BN, SiC, graphene, diamond, or the like. In an implementation, the upper layer 14442 can be deposited along a surface of the lower layer 14444, and in another implementation, the upper layer 14442 and the lower layer 14444 can be laminated together with or without an adhesive material between the layers 14442 and 14444.

FIG. 13 includes a top view of the thermal shield 1444. The upper layer 14442 is visible and covers the lower layer 14444. The upper layer 14442 may or may not have the same shape as the lower layer 14444. In the implementation illustrated in FIG. 13, the thermal shield 1444 includes a relatively wider portion 1542, a chuck portion 1546, and a connecting portion 1544 that is disposed between the portions 1542 and 1546. When in an inserted state, the chuck portion 1546 can overlie and have a shape similar to the substrate chuck that can underlie the thermal shield 1444. When a heating element overlying the chuck portion 1546 is activated, heat reaching the chuck portion 1546 can be thermally conducted to the wider portion 1542 via the connecting portion 1544. The relatively wider portion 1542 can help dissipate heat away from the substrate chuck and a positioning stage coupled to the substrate chuck than if the thermal shield had a uniform width as measured in the X-direction corresponding to the width of the chuck portion 1546.

Many designs for thermal shields have been described. Other designs can be used without departing from the concepts as described herein. Many of the thermal shields can include a chuck portion and a supporting portion that is disposed between the chuck portion and a mechanical component that is used to insert, retract, or both insert and retract the thermal shield. The thermal shield may have a uniform thickness. In another implementation, the supporting portion may be thinner or thicker than the chuck portion.

In another implementation, the chuck portion can have a different material as compared to the supporting portion. For example, the chuck portion can be made of a material having a relatively low thermal conductivity as previously described, and the support portion can be made of another material, such as glass. After reading this specification, skilled artisans will be able to determine a thickness or thicknesses and a material or materials for the thermal shield.

Attention is directed to heating members that can be used to heat the pre-cured layer before or before and during exposure to actinic radiation to form the photocured planarization layer. The heating member can include a heating element and a mechanical support structure that can be coupled to a positioning device used to insert, retract, or insert and retract the heating element. Details regarding the position device are described later in this specification.

From a top view, a heating element has a shape that corresponds to a shape of a substrate that will be processed using the heating element. The heating element can heat a pre-cured layer to a temperature higher than room temperature and at most 95° C. The heating element may or may not be transparent to the actinic radiation. If less than 70% of the actinic radiation received at a top surface of the heating member is transmitted through the heating member, the heating element may be retracted before the pre-cured layer is exposed to actinic radiation to form the photocured planarization layer.

FIG. 15 includes a heating member 1644 that includes a support structure 16442 and a transparent heating element 16444. The transparent heating element 16444 has a shape corresponding to the substrate chuck or a substrate that is processed within the station 126. The transparent heating element 16444 can also have a rectangular shape that is larger than a circular substrate chuck or circular substrate that is processed within the station 126. The transparent heating element 16444 can include a layer of an electrically conductive material, such as indium tin oxide (ITO), aluminum-doped zinc oxide (AZO), fluorine-doped tin oxide (FTO), or the like. The layer can be formed over a heating member substrate that may or may not include a material that allows at least 70% transmission of actinic radiation through the heating member substrate. For a particular material for the layer of electrically conductive material, empirical data can be collected to determine a thickness such that the heating element 16444 emits sufficient heat for heated photocuring, as described later in this specification, and the heating member 1644 allows at least 70% of the actinic radiation to be transmitted through the heating member 1644 where the heating element 16444 is located. The heating member 1644 may include an electrically conductive film that covers an entire side of the support structure 16442 and has two electrical connections on an edge of support structure 16442. The heating member 1644 may also have an antireflection coating. An example of such a heating member 1644 is the ITO window heater from Optical Solutions SRL of Genova, Italy.

FIG. 16 includes an alternative implementation that includes a heating member 1744 that includes the support structure 16442 and the heating element 17444. The transparent heating element 17444 has a shape corresponding to the substrate chuck or a substrate that is processed within the station 126. As compared to the heating element 16444 in FIG. 15, the shape of the layer of transparent electrically conductive material defines slots 17486, so that current flows in a serpentine pattern through the heating element 17444. Power supply terminals 1746 are connected to the layer of transparent electrically conductive material at locations illustrated with small black circles in FIG. 16. In addition to thickness of the material for the layer, the electrical and heat generating properties can be controlled by the number, length, and width of the slots 17486. The slots 17486 also can allow more of the actinic radiation to be transmitted through the heating element 17444. For a particular material and design for the heating element 17444, empirical data can be collected to determine a combination of thicknesses of the layer and heating member substrate for the heating element 17444 and design for the slots 17486 such that the heating element 17444 emits sufficient heat for heated photocuring, as described later in this specification, and the heating member 1744 allows at least 70% of the actinic radiation to be transmitted through the heating element 17444.

FIG. 17 includes a further implementation that includes a heating member 1844 that includes the support structure 18442 and the heating element 18444. The transparent heating element 18444 has a shape corresponding to the substrate chuck or a substrate that is processed within the station 126. The heating element 18444 can include a wire for a resistive heater. Power supply terminals 1846 are connected to the wire at locations illustrated with small black circles in FIG. 17. The wire can be on or embedded within a heating member substrate and may not be transparent to the actinic radiation. A sufficient amount of actinic radiation can pass through the heating element 18444 because the wire may occupy a relatively small amount of the area of the heating element 18444 as compared to the remaining unoccupied area of the heating member substrate within the heating element 18444. In a further implementation, a heating element can be moved in a plane defined by the X-direction and Y-direction to allow more radiation to reach the heated photocurable composition during radiation exposure.

In addition to thickness of the material for the heating member substrate, the electrical and heat generating properties can be controlled by the wire pattern for the heating element 18444. For a particular material and design for the heating element 18444, empirical data can be collected to determine the wire pattern for the heating element 18444 such that the heating element 18444 emits sufficient heat for heated photocuring, as described later in this specification, and the heating member 1844 allows at least 70% of the actinic radiation to be transmitted through the heating element 18444.

Any one or more of the thermal shields and heating members previously described can be inserted or retracted using a positioning device. FIGS. 18 and 19 include top views of the positioning device and an object 1944 in a retracted state (FIG. 18) and in an inserted state (FIG. 19). The object 1944 can be a thermal component, such as a thermal shield or a heating member. The positioning device can include an actuator 1962 and a shaft 1964 that is coupled to the actuator and the object 1944. The default state for the positioning device is the retracted state (FIG. 18). The inserted state (FIG. 19) may only be used when a substrate is present over the substrate chuck 136 as illustrated in FIG. 3.

The actuator can be an electrical actuator, a pneumatic actuator, or a hydraulic actuator. An example of an electrical actuator can be a linear motor. The controller 150 or a local controller can transmit a signal for activating a circuit within the actuator 1962 to cause the shaft 1964 to extend to the inserted state as illustrated in FIG. 19. The controller 150 or a local controller can transmit a signal for deactivating the circuit within the actuator 1962. After heating or after heating and exposing the pre-cured layer to actinic radiation, the positioning device can be returned to the retracted state. The positioning device can be returned to the retracted state by the controller or a local controller transmitting a signal to reverse current through the circuit or activating a different circuit to cause the shaft 1964 to retract to the retracted state as illustrated in FIG. 18.

For the pneumatic actuator or the hydraulic actuator, a pressurized fluid can be used to transition from the retracted state to the inserted state. The shaft 1964 may be coupled to a piston within the actuator 1962. The controller 150 or a local controller can transmit a signal for a pressurization control valve to open and allow a fluid (gas for the pneumatic actuator, liquid for the hydraulic actuator) from a fluid source coupled to the actuator 1962 to increase pressure within a pressurization chamber within actuator 1962 causing the piston and shaft 1964 to move toward the right-hand side of FIG. 19 until the inserted state is reached. After heating or after heating and exposing the pre-cured layer to actinic radiation, the positioning device can be returned to the retracted state. The controller 150 or a local controller can transmit a signal to deactivate the pressurization control valve and a signal to activate a depressurization control valve. The depressurization control valve may be coupled to the room ambient or a vacuum line (pneumatic actuator) or a return line (hydraulic actuator). If needed or desired, a spring may be coupled to the object 1944 to help the object

1944 return to the retracted state. The spring may be connected to the object, the shaft 1964, or, if present, coupled to the piston within the actuator 1962.

More than one positioning device can be used in conjunction with the actuator 1962 in FIGS. 18 and 19. In an implementation, a spring can be a positioning device that is external to the actuator 1962. The spring can be coupled to the object 1944. The actuator 1962 can be activated when inserting the object, and the spring can help the object 1944 return to the retracted state when the actuator 1962 is deactivated.

The positioning device can be an electro-mechanical device. FIGS. 20 and 21 include bottom and side views, respectively, of a positioning device and an object 2144 in the retracted state. The object can be a thermal component, such as a thermal shield or a heating member. FIGS. 22 and 23 include bottom and side views, respectively, of the positioning device and the object 2144 in the inserted state. The object 2144 can be coupled to a ball screw 2166. Guide rails 2168 pass through the ball screw 2166 to keep the ball screw from rotating and thus allowing linear motion of the ball screw 2166 and the object 2144. Although not illustrated, each of the guide rails 2168 is fastened to a support member within the radiation exposure station 126. A worm gear 2164 is coupled to the ball screw 2166 and an actuator 2162, such as a motor. The motor can be a stepper motor in a particular implementation. When the motor rotates the worm gear in one direction, the object 2144 can move in a direction toward the right-hand side of FIGS. 20 to 23, and when motor rotates the worm gear in the opposite direction, the object 2144 can move in a direction toward the left-hand side of FIGS. 20 to 23. The positioning device can also include a rotary arm that rotates one or both of the thermal shield and the heating member to and from an inserted state and a retracted state.

To move from the retracted state (FIGS. 20 and 21) to the inserted state (FIGS. 22 and 23), the controller 150 or a local controller can transmit a signal to activate the actuator 2162 that rotates the worm gear 2164 in a direction to cause the ball screw 2166 to move along the guide rails 2168 to the right-hand side of FIGS. 20 to 23. The object 2144 is coupled to the ball screw 2166 and moves with the ball screw 2166. The controller 150 or a local controller can transmit a signal to deactivate the actuator 2162 after the inserted state is reached. To move from the inserted state (FIGS. 22 and 23) to the retracted state (FIGS. 20 and 21), the controller 150 or a local controller can transmit a signal to activate the actuator 2162 that rotates the worm gear 2164 in the opposite direction to cause the ball screw 2166 to move along the guide rails 2168 to the left-hand side of FIGS. 20 to 23. The controller 150 or a local controller can transmit a signal to deactivate the actuator 2162 after the retracted state is reached.

Particle generation may be a design concern, and in particular, for the positioning device. The positioning device as illustrated in FIGS. 20 to 23 may be more likely to generate particles as compared to the positioning devices as described with respect to FIGS. 18 and 19. In FIGS. 20 to 23, the ball screw 2166, the worm gear 2164, and guide rails 2168 are located at elevations lower than the object 2144. In another implementation, the ball screw 2166, the worm gear 2164, and guide rails 2168 are located at elevations higher than the object 2144. In a further implementation, the ball screw 2166, the worm gear 2164, and guide rails 2168 may lie along a vertical plane in the Z-direction, as opposed to a horizontal X-Y plane. An L-shaped bracket can be coupled between the ball screw 2166 and the object 2144. After reading this specification, skilled artisans will be able to select a positioning device and its orientation (at an elevation below, an elevation above, or to a lateral side of the object 1944 or 2144) for a particular application. In the same or different implementation, positioning devices, such as those described herein and others, may have actuators or other moving parts located outside the processing area to reduce the likelihood of particles from such actuators or other moving parts would reach a substrate or a layer overlying the substrate.

In an implementation, an actuator can be coupled to the heating member 542, and another actuator can be coupled to the thermal shield 544. Such an implementation can allow the heating member 542 to move independently of the thermal shield 544, or vice versa. In another implementation, the same actuator can be coupled to heating member 542 and the thermal shield 544. Such an implementation can be used to insert the heating member 542 and the thermal shield 544 at the same time and retract the heating member 542 and the thermal shield 544 at the same time.

In other implementations, a system can include an insertable heating member and a thermal shield in a fixed position, or a system can include a heating member in a fixed position and an insertable thermal shield. FIG. 24 includes a cross-sectional view of a heated radiation exposure station 2576 that includes a thermal shield 2544 in a fixed position and the insertable heating member 542. Any one or all of the heated radiation exposure stations 126 can be replaced by one or more heated radiation exposure stations that are identical to the heated radiation exposure station 2576. The thermal shield 2544 can lie along a chucking surface of the substrate chuck 136. The thermal shield 2544 may include channels or other features to allow a vacuum to hold the substrate 502 or a pressurized fluid to modulate the substrate 502 while being held in place. The thermal shield 2544 can include any of the materials and thicknesses with respect to any of the previously described thermal shields. From a top view, the periphery of thermal shield 2544 can have a shape that corresponds to the shape of the substrate chuck 136. The thermal shield 2544 may or may not have the supporting portion or connecting portion as illustrated with other thermal shields previously described.

FIG. 25 includes a cross-sectional view of a heated radiation exposure station 2676 that includes a heating member 2642 in a fixed position and the insertable thermal shield 544. Any one or all of the heated radiation exposure stations 126 can be replaced by one or more heated radiation exposure stations that are identical to the heated radiation exposure station 2676. As illustrated in FIG. 25, the heating member 2642 can include a transparent heating element that allows at least 70% of the actinic radiation to be transmitted through the heating element. In a further implementation, the pre-cured layer 522 can be heated in one station and exposed to actinic radiation in another station. In such an implementation, the heating element may or may not be transparent to the actinic radiation. The heating member 2642 can include any of the materials and thicknesses as previously described with respect to any of the previously described heating members.

FIG. 26 includes a cross-sectional view of a heated radiation exposure station 2776 that includes a substrate chuck 2786 and the insertable heating member 542. Any one or all of the heated radiation exposure stations 126 can be replaced by one or more heated radiation exposure stations that are identical to the heated radiation exposure station 2776. The substrate chuck 2786 can include a low thermal conductivity material and help to reduce the amount of heat that reaches the positioning stage 596. The substrate chuck 2786 can be a particular type of the substrate chuck 136. The substrate chuck 2786 can be identical to the substrate chuck 136 regarding channels or other features to allow a vacuum to hold the substrate 502 or a pressurized fluid to modulate the substrate 502 while being held in place. The substrate chuck 2786 can include any of the materials and thicknesses as previously described with respect to any of the previously described thermal shields. In a further implementation, the substrate chuck 2786 can include the lift pins 586 or 1076, and the heated radiation exposure station 2776 can further include the insertable thermal shield 544 as illustrated in FIG. 3.

FIG. 27 includes a cross-sectional view of a radiation exposure station 2876 that does not include an insertable heating member or an insertable thermal shield. The design of the radiation exposure station 2876 can be simplified as compared to other designs because it does not need to include a positioning device as previously described and illustrated with respect to FIGS. 18 to 23. The radiation exposure station includes a substrate chuck 2886 that can include a heated chuck section 28862, a thermal shield section 28864, an optional active cooling section 28866, and an optional thermal shield section 28868. The heated chuck section 28862 can include any of the heating means as previously described with respect to the substrate chuck 136. The thermal shield section 28864, the thermal shield section 28868, or both can include any one or more of the materials previously described with respect to the thermal shield 544. The thermal shield section 28864 can include the same material or different materials as compared to the thermal shield section 28868 when both sections are present. The active cooling section 28866 can include a channel or other flow path to allow a cooling fluid to flow through the active cooling section 28866. Any one or more of the sections 28864, 28866, and 28868 can reduce the amount of heat that reaches the positioning stage 596.

Many alternative implementations for the systems and equipment may be used. The number of each type of station can be different from what is illustrated in order to increase throughput or as needed or desired for a particular physical design of an apparatus or station within the apparatus. For example, more than one planarization head station 125 may be used. When at least two planarization head stations are used, (1) all planarization head stations may be used between dispensing and curing operations, or (2) at least one planarization head station may be used between dispensing and curing operations and at least one other planarization head station may be used after one or both curing operations. For each type of station, the number and location of the stations can be tailored for a particular application. Each planarization head station shares a positioning stage with at least one heated radiation exposure station.

Functionality described with respect to a particular station may be performed by different stations. As was previously addressed, functionality associated with the planarization head station 125 may be incorporated into the dispense station 123 or the radiation exposure station 126, and thus, the planarization head station 125 may not be needed. In another implementation, exposure to actinic radiation may occur at more than one temperature. In this implementation, the heated radiation exposure station 126 may heat the pre-cured layer to a first temperature prior to curing and an optional radiation exposure station may heat the cured planarization layer to a second temperature when the further curing is performed. In a further implementation, different exposures to actinic radiation may be performed within the same radiation exposure station. For example, within the same radiation station, a radiation exposure at a lower temperature may be performed, the substrate and pre-cured layer are heated to a higher temperature, and the substrate and the pre-cured layer are exposed to actinic radiation at the higher temperature. Before exposing the next substrate and pre-cured layer, the radiation exposure station may be cooled to be closer to the lower temperature. However, the cooling may adversely affect system throughput or a greater number of radiation exposure stations may be used to keep the system throughput unchanged. After reading this specification, skilled artisans will be able to determine how many types and the number of radiation exposure stations to use.

More or fewer apparatuses and the selection of which stations are within each apparatus can be tailored for a particular application. The stations 123, 125, and 126 may be within the same apparatus to reduce process variability. The optional curing stations may be in a different apparatus. The optional curing stations may be within the bake apparatus 201. Thermal insulation may be used between the optional radiation exposure stations and the bake stations 276, or the heated radiation exposure stations 126 may be sufficiently spaced apart from the bake stations 276, so that heat emitted by the bake stations 276 does not interfere with the temperature control within the heated radiation exposure stations 126. Thermal insulation may be used between the heated radiation exposure stations 126 and one or both of the dispense station 123 and the planarization head station 125. In a further implementation, the optional heated radiation exposure stations may be within their own apparatus and not shared with any of the stations 123, 125, 126, and 276. In yet another implementation, the number of apparatuses may depend on the layout, facilities connections, or both within the room where the apparatuses are located. After reading this specification, skilled artisans will be able to the number, design, and location of apparatuses for a particular system.

Attention is directed to methods of using the system 100 to form a baked planarization layer over a substrate. FIGS. 28 and 29 include a process flow diagram of a method that is described with respect to system illustrated and described with respect to FIGS. 1 to 5, 18, and 19. A particular process flow is described below in conjunction with the figures and is directed to an IAP process. Many different process flows can be used and still achieve the benefits using the concepts described herein. As used hereinafter, an unpatterned superstrate is referred to as a blank, and a patterned superstrate is referred to as a template. Other variants from the process flow are described later in this specification. At least some features within FIGS. 30 to 41 are not drawn to scale in order to allow such and other features to be understood better with respect to the methods described.

Referring to FIG. 1, the method can include transferring a substrate from the substrate pod 121 to the dispense station 123. The controller 150 or a local controller can transmit a signal for the substrate transfer tool 110 to remove the substrate 502 from the substrate pod 121 and move the substrate 502 to the dispense station 123. The substrate transfer tool 110 can place the substrate 502 on the substrate chuck 133 within the dispense station 123.

The method can include dispensing a photocurable composition over a substrate at block 2922 in FIG. 28. The photocurable composition can include a polymerizable material and a photoinitiator. The photocurable composition may or may not include a solvent. In a further implementation, the photocurable composition can contain another additive. A non-limiting example of the other additive can be a surfactant, a dispersant, a stabilizer, an inhibitor, a dye, or a combination thereof.

Returning to the method and FIGS. 1 and 30, the dispense head 146 dispenses droplets 3122 of the photocurable composition over the exposed surface of the substrate 502 as illustrated in FIG. 30. During a dispensing operation, the substrate chuck 133 can be coupled to a positioning stage 196 that is configured to move the substrate chuck 133 (illustrated by the arrow adjacent to the substrate 502 in FIG. 30) during a dispensing operation. In another implementation, the dispense head 146 moves while the substrate chuck 133 is stationary, and in a further implementation, both substrate chuck 133 and the dispense head 146 move during dispensing. Thus, the substrate 502 can move, and the dispense head 146 may be stationary or also move.

The substrate 502 can have an exposed surface having a projection that lies at a relatively higher elevation as compared to an adjacent recession. In FIG. 30, the exposed surface of the substrate 502 has protrusions 3142 and recessions 3144. The substrate 502 has a local area with a relatively higher areal density of protrusions 3142 as compared to the recessions 3144 and another local area with a relatively higher areal density of recessions 3144 as compared to the protrusions 3142. A lower areal density of the photocurable composition is dispensed where protrusions 3142 occupy a relatively larger fraction of a local area, and a higher areal density of the photocurable composition is dispensed where recessions 3144 occupy a relatively larger fraction of a different local area. In practice, the exposed surface of the substrate 502 is significantly more complex than illustrated in FIG. 30 and is not limited to only two elevations. The exposed surface of the substrate 502 in FIG. 30 is simplified to aid in understanding the concepts described herein.

The controller 150 or a local controller can transmit signals so that the dispense head 146, the positioning stage 196 coupled to the substrate chuck 133 (when the substrate chuck 133 is coupled to the positioning stage), or both move in a desired direction and velocity, and the dispense head 146 dispenses the droplets 3122 of the photocurable composition at a desired rate in order to achieve proper local areal densities of the photocurable composition along the exposed surface of the substrate 502.

Referring to FIGS. 1 and 30, after the droplets 3122 of the photocurable composition is dispensed, the substrate 502 and the droplets 3122 of the photocurable composition can be moved from the dispense station 123 to the planarization head station 125. The controller 150 or a local controller can transmit a signal for the substrate transfer tool 110 to move the substrate 502 and the droplets 3122 of the photocurable composition from the dispense station 123 to the planarization head station 125 and onto the substrate chuck 136 coupled to the positioning stage 596. Referring to FIGS. 1 and 3, the positioning stage 596 and the substrate chuck 136 are moved from the heated radiation exposure station 126 to the planarization head station 125 if the positioning stage 596 and the substrate chuck 136 were not in the planarization head station 125 before the substrate 502 and the droplets 3122 are transferred to the planarization head station 125.

The process further includes contacting the photocurable composition with a superstrate at block 2924 in FIG. 28. Referring to FIG. 31, the superstrate 592 can be used to aid in forming a pre-cured layer from the droplets 3122 of the photocurable composition. In an implementation, the superstrate 592 can be a blank with a planar bottom surface facing the substrate 502 and the droplets 3122. The planarization head station 125 can include a superstrate handler (not illustrated) that can be used to move and position the superstrate 592. In the same or different implementation, the superstrate 592 can be held by a planarization head within the radiation exposure station 126.

The superstrate 592 has a transmittance of at least 70%, at least 80%, at least 85%, or at least 90% for actinic radiation used to photocure the photocurable composition. The superstrate 592 can include a glass-based material, an organic polymer, a siloxane polymer, a fluorocarbon polymer, a sapphire, a spinel, silicon, metal, another similar material, or any combination thereof. The glass-based material can include soda lime glass, borosilicate glass, alkali-barium silicate glass, aluminosilicate glass, quartz, fused-silica, or the like. In an implementation, the actinic radiation can be ultraviolet radiation, and a glass-based material can be used for the superstrate 592. The superstrate 592 can have a thickness in a range from 30 microns to 2000 microns. The contacting surface of the superstrate 592 can have a surface area that is at least 90%, 95%, 96%, 97%, or 99% of the area of the substrate 502 and may have a surface area that is the same or larger than the substrate 502. The superstrate 592 may have a gas absorbing layer that has a low surface energy relative to the photocured planarization layer that reduces the separation force between the superstrate and the photo-cured planarization layer.

The contacting surface of the superstrate 592 has a two-dimensional shape including a circle, an ellipse, a rectangle (including a square), a hexagon, or the like. The two-dimensional shape can be the same as an outer shape of the substrate 502. For example, both can be circles. In the implementation illustrated in FIG. 31, the contacting surface does not have any recessions and protrusions.

Referring to FIGS. 1, 31, and 32, the controller 150 or a local controller can transmit a signal for the superstrate 592 and the droplets 3122 to move closer and contact each other. The superstrate 592 may be moved, the substrate chuck 136 may be moved, or both the superstrate 592 and the substrate chuck 136 can be moved. As the superstrate 592 contacts droplets 3122 of the photocurable composition, and the droplets 3122 can coalesce to form a pre-cured layer 522 of the photocurable composition. The upper surface 512 of the pre-cured layer 522 conforms to the bottom, contacting surface of the superstrate 592.

Referring to FIGS. 1 and 32, the positioning stage 596 coupled to the substrate chuck 136 can transfer the substrate 502 and the pre-cured layer 522 from the planarization head station 125 to the heated radiation exposure station 126. The controller 150 or a local controller can transmit a signal for the positioning stage 596 to move the substrate chuck 136, the substrate 502, and the pre-cured layer 522 from the planarization head station 125 to the radiation exposure station 126.

FIG. 33 includes a cross-sectional view of a portion of the heated radiation exposure station 126 at this point in the method. As compared to FIG. 3, the lift pins 586 in FIG. 33 are in the retracted state. An insertable heating member and an insertable thermal shield are present within the system 100 and are in a retracted state. Thus, the insertable heating member and the insertable thermal shield are present within the system 100 but are not illustrated in FIG. 33.

The method can include raising the substrate and pre-cured layer above a chucking surface at block 2962 in FIG. 28. FIG. 34 includes a cross-sectional view where the lift pins 586 are in the extended state. The substrate 502 is spaced apart and does not contact the chucking surface of the substrate chuck 136. The controller 150 or a local controller can transmit a signal for the lift pins 586 to be raised. A motor or pneumatic line coupled to the lift pins 586 can be turned on to raise the lift pins 586.

The method further includes inserting an insertable thermal shield at block 2964 and inserting an insertable heating element at block 2966 in FIG. 28. Referring to FIG. 35, the order in which the thermal shield 544 and the heating member 542 are inserted can be reversed. Further, the heating member 542 may be inserted before raising the lift pins 586 as previously described with respect to block 2962 in FIG. 28. In the case where a heating member is sufficiently transparent to the actinic radiation, the heating member may be in a fixed position and inserting the heating member will not be performed. Thus, the action in block 2966 may be optional depending on the equipment configuration. The description below is based on the insertable heating 542.

Referring to FIGS. 18 and 19, either or both of the thermal shield 544 and the heating member 542 can be coupled to a positioning device that includes the actuator 1962 and the shaft 1964. The controller 150 or a local controller can transmit a signal for the actuator 1962 to move the object 1944 (e.g., the thermal shield 544 or the heating member 542) from the retracted state in FIG. 18 to the inserted state in FIG. 19. From a top view, the center of the substrate 502 and the center of the circular portion of the object 1944 are along a vertical centerline (in the Z-direction) or no more than 1 cm away from being along the vertical centerline.

The process further includes heating the pre-cured layer at block 2968 in FIG. 28. After the pre-cured layer 522 is heated to a targeted temperature in block 2968, the pre-cured layer 522 can be exposed to actinic radiation in block 3022 in FIG. 29. Heating may be terminated before the pre-cured layer 522 is exposed to actinic radiation or heating may be continued to keep the pre-cured layer 522 at the targeted temperature during exposure to actinic radiation. If the heating is terminated before exposing the pre-cured layer 522 to actinic radiation, the targeted temperature may be higher than desired radiation exposure temperature to account for some cooling between the time heating is terminated and until some time during the subsequent exposure, such as the beginning, middle, end, or another time during the exposure. If heating continues during the exposure, the targeted temperature may or may not be the same as the desired radiation exposure temperature.

The desired radiation exposure temperature is greater than room temperature may be at most 95° C., at most 85° C., or at most 70° C. The desired radiation exposure temperature can be in a range from 25° C. to 95° C., 30° C. to 85° C., or 35° C. to 70° C. The targeted temperature of the heating may be the same or a few degrees warmer than the desired radiation exposure temperature. The targeted temperature can be in a range from 25° C. to 98° C., 30° C. to 88° C., or 35° C. to 73° C. The desired radiation exposure temperature can be set based on one or more of: the baking temperature; the composition of the pre-cured layer; the experimentally determined relative shrinking of the pre-cured layer after baking; the experimentally determined relative shrinking of the photocured planarization layer after baking; and the planarization performance after baking.

Referring to FIG. 36, the temperature sensor 564 can be used to monitor the temperature of the pre-cured layer 522 by measuring the temperature of the pre-cured layer 522 or the substrate 502. The substrate 502 has substantially more mass than the pre-cured layer 522, and the temperature of the substrate 502 can be used for the temperature of the pre-cured layer 522.

During heating (illustrated with arrows 3944), the controller 150 or a local controller can receive temperature data from the temperature sensor 562 and the controller 150 or the local control can transmit a signal for the heating member 542 to heat the substrate 502 and the pre-cured layer 522 to the targeted temperature. After the pre-cured layer 522 reaches the targeted temperature, the controller 150 or a local controller can transmit a signal for the heating member 542 to terminate or continue heating the pre-cured layer 522 at the targeted temperature.

In an implementation, heating is terminated before exposing the pre-cured layer 522 to actinic radiation. The method can include retracting the insertable heating element at block 3042 in FIG. 29. In the case where the heating member 542 is sufficiently transparent to the actinic radiation, the heating member may be in a fixed position. Referring to FIGS. 18 and 19, the controller 150 or a local controller can transmit a signal for the actuator 1962 to move the object 1944 that is the heating member 542 in this implementation from the inserted state in FIG. 19 to the retracted state in FIG. 18. Although the heating member 542 is present in the system 100, the heating member 542 is no longer disposed between the radiation source 532 and the pre-cured layer 522, as illustrated in FIG. 37.

The method can further include exposing the pre-cured layer to actinic radiation to form a photocured planarization layer at block 3022 in FIG. 29. Referring to FIG. 1, for a particular photocurable composition, the memory 152 can include information regarding a targeted wavelength or a targeted range of wavelengths for the actinic radiation, a targeted total dose or a targeted range of total doses to be used for the photocurable composition, a dose used when exposing the pre-cured layer 522 to actinic radiation to form the photocured planarization layer, or other data related to exposing the photocurable composition to actinic radiation. Such information can be used by the controller 150 or a local controller to determine parameters for exposing the pre-cured layer 522 to the actinic radiation. The temperature at the time of the heated radiation exposure is referred to herein as the actual radiation exposure temperature. The actual radiation exposure temperature can be at or near the desired radiation exposure temperature. The actual radiation exposure temperature can be any of the targeted temperatures and tolerances previously described.

Referring to FIGS. 1, 37, and 38, the controller 150 or a local controller can receive a signal from the temperature sensor 564 or a derivative of such signal and determine if the temperature is at or within a tolerance (for example, +/−5° C., +/−2° C., +/−1° C., or +/−0.5° C.) of the desired radiation exposure temperature. When the temperature is at or within a tolerance of the desired radiation exposure temperature, the controller 150 or a local controller can transmit a signal for an actinic radiation source 532 to be activated as illustrated in FIG. 38. In an implementation, each triangle illustrates radiation being emitted from the actinic radiation source 532. The actinic radiation can have a wavelength of at least 10 nm and less than 700 nm. The actinic radiation can be ultraviolet radiation having a wavelength in a range from 100 nm to 400 nm, and more particularly, in a range from 200 nm to 400 nm. A supplier of the photocurable composition may provide a targeted wavelength or a targeted range of wavelengths to be used to photocure the photocurable composition.

Energy from the exposure to actinic radiation forms the photocured planarization layer 4222 illustrated in FIG. 39. The energy polymerizes the polymerizable material to form polymer material or covalent bonds with neighboring molecules to form a cross-linked material. The polymer material can be a single polymer compound or may be a co-polymer. The exposure to the actinic radiation during the heated radiation exposure substantially polymerizes but may not fully polymerize the polymerizable material within the photocured planarization layer 4222. In an implementation, no further exposure to actinic radiation may occur. Further polymerization may occur during a post-exposure baking of the photocured planarization layer 4222 due to thermal curing.

The thermal shield 544 can help to reduce heat that reaches the positioning stage 596. In an implementation, the temperature of the positioning stage 596 can be at least 30° C. below the temperature of the pre-cured layer 522 during the heating operation (block 2968), the exposure operation (block 3042), or both. Heating and curing the pre-cured layer 522 can result in heating other components within the system 100. The thermal shield 544 helps to protect the positioning stage 596 and increases the likelihood that the positioning stage 596 does not increase or increases by less than a positioning stage temperature variation threshold (which may be, for example, 1° C., 5° C., or 10° C.). The positioning stage temperature variation threshold is selected based on the ability of the positioning stage to maintain a positioning accuracy that is less than a desired positioning a stage accuracy (which may be, for example, 1 nm, 10 nm, or 100 nm). Any thermal deformation of the positioning stage can result in a reduction in the stage compliance. Any thermal deformation of the positioning stage greater than a thermal deformation threshold can result in a variability in the force that the planarization head applies to the superstrate, which reduces the planarization performance (for example 3 nm) of the system 100. The thermal deformation threshold may be, for example, 50 µm, 10 µm, 5 µm, or 1 µm.

The superstrate 592 can be removed after forming the photocured planarization layer 4222. The photocurable composition can include an internal mold release agent that remains in the photocured planarization layer 4222 after polymerization. The internal mold release agent can help to reduce the likelihood of damaging the photocured planarization layer 4222 or removing part or all of the photocured planarization layer 4222 when removing the superstrate 592. The superstrate 592 can also include a mold release agent.

The method can further include retracting the insertable thermal shield at block 3044 in FIG. 29. Referring to FIGS. 18 and 19, the object 1944 is the thermal shield 544 for this implementation. The controller 150 or a local controller can transmit a signal for the actuator 1962 to move the object 1944 from the inserted state in FIG. 19 to the retracted state in FIG. 18. Although the thermal shield 544 is present in the system 100, the thermal shield 544 is no longer disposed between the substrate chuck 136 and the substrate 502, as illustrated in FIG. 39.

The method can include lowering the substrate and photocured planarization layer onto the chucking surface at block 3046 in FIG. 29. FIG. 40 includes a cross-sectional view where the lift pins 586 are in the retracted state. The substrate 502 contacts the chucking surface of the substrate chuck 136. The controller 150 or a local controller can transmit a signal for the lift pins 586 to be lowered. A motor or pneumatic line coupled to the lift pins 586 can be turned off or reversed in direction to lower the lift pins 586.

The method can include removing the superstrate from the photocured planarization layer at block 3062 in FIG. 29. The controller 150 or a local controller can transmit a signal for the positioning stage 596 to move from the heated radiation exposure station 126 to the planarization head station 125. The controller 150 or a local controller can transmit a signal for the planarization head 135 to remove the superstrate 592 from the photocured planarization layer 4222.

The method can include moving the substrate 502 and the photocured planarization layer 4222 from the heated radiation exposure station 126 to the bake apparatus 201. Referring to FIGS. 1 and 2, 40, and 41, the controller 150 or a local controller can transmit a signal for the substrate transfer tool 110 to remove the substrate 502 and the photocured planarization layer 4222 from the planarization head station 125 and move the substrate 502 and the photocured planarization layer 4222 to the substrate pod 121 or another substrate pod. The substrate pod 121 or the other substrate pod can be moved to the bake apparatus 201 for further processing. In another implementation, the substrate 502 and photocured planarization layer 4222 can be moved to the substrate pod 271 in FIG. 2. The substrate transfer tool 210 can place the substrate 502 on a substrate chuck 286 within one of the post-exposure bake stations 276.

The method can include baking the photocured planarization layer to form a baked planarization layer at block 3082 in FIG. 29. During the baking operation, the material within the photocured planarization layer 4222 can further polymerize, cross-link, or both. The baking operation can also help remove a relatively volatile component, if present, from the photocured planarization layer 4222 when forming a baked planarization layer 4402 in FIG. 41. The baked planarization layer 4402 has an upper surface 4412.

A heating means within the post-exposure bake station 276 is used to heat the photocured planarization layer 4222 (FIG. 40) to form the baked planarization layer 4402 (FIG. 41). Any of the heating means previously described with respect to the heat operation within the heated radiation exposure station 126 can be used for the baking operation within the bake station 276. The heating means within the heated radiation exposure station 126 and within the bake station 276 can be identical to or substantially different from each other. FIG. 41 illustrates a resistive heating element 4422 within the substrate chuck 286 and a radiative heating element 4424 positioned over the substrate chuck 286. The heating means provides heat at a temperature higher than the temperature used for the heated radiation exposure operation. The baking temperature can be at least 300° C., at least 325° C., or at least 350° C. The baking temperature should not be so high as to cause significant decomposition or another adverse effect to the baked planarization layer 4402. The baking temperature can be at most 500° C., at most 450° C., or at most 400° C. The baking temperature can be a value between any of the minimum and maximum numbers noted above, for example, in a range from 300° C. to 500° C., 300° C. to 450° C., or 300° C. to 400° C. In a particular implementation, the baking temperature can be in a range from 350° C. to 400° C.

A soak time is the time the substrate 502 and overlying polymer layer is at the baking temperature. The soak time needs to be sufficient to achieve a needed or desired amount of further polymerization or cross-linking, reduce the amount of a volatile component within the polymer layer to a desired amount, or both. The soak time can be at least 0.25 minute, at least 1 minute, or at least 3 minutes. After a long enough time, further exposure to the baking temperature may not sufficiently improve the polymer layer (a sufficient amount of polymerization or cross-linking has occurred, a remaining amount of the volatile component is low enough to not cause a problem during subsequent processing, etc.) or may start to cause an adverse effect, such as roughening the upper surface 4412 of the baked planarization layer 4402, possible delamination of the baked planarization layer 4402 from the substrate 502, or the like. The soak time may be at most 30 minutes, at most 20 minutes, or at most 15 minutes. The soak time can be a value between any of the minimum and maximum numbers noted above, for example, in a range from 0.25 minute to 30 minutes, 1 minute to 20 minutes, or 3 minutes to 15 minutes.

The baking operation can be performed using a gas. The gas can include a material that is relatively inert to the photocured planarization layer 4222 and the baked planarization layer 4402. The material can include $N_2$, $CO_2$, a noble gas (Ar, He, or the like), or a mixture thereof. The gas may not include an oxidizing material, for example $O_2$, $O_3$, $N_2O$, or the like, or may include no more than 2 mol % or no more than 0.5 mol % of the oxidizing material.

As illustrated, the post-exposure bake stations 276 are configured to process a single substrate at a time. In another implementation, the post-exposure bake stations 276 can be configured to process a plurality of substrates during the same baking operation. The post-exposure bake stations 276 may include a cassette or another suitable substrate container or be capable of receiving the cassette or the other suitable substrate container, where the cassette or the other suitable substrate container can hold a plurality of substrates.

The memory 252, a database, or another memory outside the post-exposure bake apparatus 201 can include information regarding the composition of or polymer precursor used to form the photocured planarization layer 4222, a desired baking temperature, a desired soak time to form the baked planarization layer 4402, or a combination thereof. Referring to FIG. 2, the controller 250 or a local controller can transmit a signal for the post-exposure bake station 276 to flow the inert gas within the post-exposure bake station 276 and control the heating means to maintain the substrate 502 and the photocured planarization layer 4222 at or within an allowable tolerance of the desired baking temperature for the soak time. The allowable tolerance may be +/−10° C., +/−5° C., or +/−2° C. of the desired baking temperature. Referring to FIG. 41, during heating, the controller 250 or a local controller can receive temperature data from a temperature sensor 4432 or 4434 and the controller 250 or the local control can transmit a signal for the heating means, such as the resistive heating element 4422 or the radiative heat element 4424, to heat the substrate 502 and the photocured planarization layer 4222 to the baking temperature or to maintain the temperature within the post-exposure bake station 276 at the baking temperature.

After the soak time, the controller 250 or a local controller can transmit a signal for the heating means to be deactivated and for substrate transfer tool 210 to remove the substrate 502 and baked planarization layer 4402 from the post-exposure bake station 276. The substrate 502 and baked planarization layer 4402 can be moved by the substrate transfer tool 210 to a chill plate to reduce the temperature of the substrate 502 and the baked planarization layer 4402 before the substrate 502 and baked planarization layer 4402 are moved back to the substrate pod 271. After chilling is completed, the controller 250 or a local controller can transmit signal for the substrate 502 and baked planarization layer 4402 to be moved to the substrate pod 271.

After reading this specification, skilled artisans will appreciate that many system configurations and processing options are available without deviating from the concepts described herein. Skilled artisans will be able to determine a particular system configuration and a particular method to use to meet the needs or desires for a particular application.

The process described above can be used in forming a planarization layer from a photocurable composition. The process described above can be integrated as part of a manufacturing method of making an article. The article can be an electrical circuit element, an optical element, a micro-electromechanical system (MEMS), a recording element, a sensor, a mold, an integrated circuit, or the like. The integrated circuit may be a solid state memory (such as a dynamic random access memory (DRAM), a static random access memory (SRAM), a flash memory, and a magnetoresistive random access memory (MRAM)), a microprocessor, a microcontroller, a graphics processing unit, a digital signal processor, a field programmable gate array (FPGA) or a semiconductor element, a power transistor, a charge coupled-device (CCD), an image sensor, or the like.

The method can further include subjecting the substrate 502 and the baked planarization layer 4402 to other processes for device (article) fabrication, including, for example, curing, oxidation, layer formation, deposition, doping, planarization, lithography, etching, formable material removal, dicing, bonding, and packaging, and the like. The substrate may be processed to produce a plurality of articles (devices), for example, the substrate may be a semiconductor wafer.

In an alternative implementation, more than one radiation exposure may be performed. For example, the other radiation exposure may be performed at room temperature before the heated radiation exposure previously described. The other radiation exposure may be performed in the radiation exposure station 126 before heating for the heated radiation exposure or may be performed in a separate radiation exposure station. In another example, the other radiation exposure may be performed between the heated radiation exposure and the baking operation. After reading this specification, skilled artisans will be able to determine the number of radiation exposure, environment conditions (e.g., temperature and areal radiation density), and the number of radiation exposure stations to be used for a particular application.

Methods of using the system described herein may allow for operations described above to be performed in a different order than described with respect to FIGS. 28 and 29. Insertion and retracting of the thermal shield 544 and the heating member 542 can be changed from what is illustrated. In another implementation, inserting the heating element of the heating member 542 (block 2966) may be performed before inserting the thermal shield 544 (block 2964) or before raising the substrate (block 2962). Retracting the heating element (block 3042) may be performed any time before the substrate 502 and photocured planarization layer 4222 are removed from the heated radiation exposure station 126. For example, at least 70% of the actinic radiation may be transmitted through a transparent heating element of the heating member 542. Such heating member 542 can remain in the inserted state during the exposure operation of block 3042. Retracting the thermal shield 544 may be performed after heating using the heating member 542 has terminated. The exposure operation of block 3022 may be performed before or after retracting the thermal shield (block 3042) or both retracting the thermal shield 544 (block 3062) and lowering the substrate (block 3046).

One or more actions within the process flow diagram in FIGS. 28 and 29 may not be performed. In an implementation, the heating member or the thermal shield may be fixed in position and not be insertable. In a system where the heating member is in a fixed position, inserting the heating element (block 2966) and retracting the heating element (block 3042) are not performed. In a system where the thermal shield is in a fixed position, inserting the thermal shield (block 2964) and retracting the thermal shield (block 3044) are not performed.

Other implementations regarding the order or necessity of actions with respect to methods described herein are possible. After reading this specification, skilled artisans will be able to determine actions and order in which the actions are performed for a particular application.

Implementations as described herein can help to control where heat from a heating element is emitted and where such heat is received. The heating member with the heating element spaced apart from the positioning stage and the substrate chuck can help to reduce the amount of heat that reaches the positioning stage and the substrate chuck. A thermal shield can be disposed between a substrate and the substrate chuck when heating a substrate and a partly cured planarization layer or a pre-cured layer of a photocurable composition. The thermal shield can help to further reduce heat that would otherwise be received by the positioning stage or the substrate chuck in the absence of the thermal shield.

One or both of the positioning stage and the substrate chuck may be sensitive to heat that is used to heat a partly cured planarization layer or a pre-cured layer of a photocurable composition. Less heat may result is less drift of any of the moving parts of the substrate chuck, the positioning stage, or both. In particular, precise movement of the positioning stage can be affected by repeated heating and cooling of a plurality of the substrates and its corresponding partly cured planarization layers or pre-cured layers. Recalibration of the positioning stage to ensure proper positioning may not be performed or performed less frequently between maintenance intervals for the station where heating is performed. Further, any one or more components of the substrate stage or positioning stage may be bend, warp, or otherwise become disfigured from the repeated heating and cooling if heat flow within the station is not controlled. The substrate chuck, positioning stage, or both may have a longer time of useful life.

One or both of the heating member and thermal shield can be reversibly moved between inserted and retracted states and can be referred to as an insertable heating member and an insertable thermal shield. The insertable heating member, the insertable thermal shield, or both may be in a retracted state to allow a substrate to be placed more easily into or removed from the station by a substrate transfer tool as compared to a heating member, a thermal shield, or both being in a fixed position. The vertical (Z-direction) dimension of the station where heating is performed may be reduced, the operational specification regarding positioning of a robot arm, a robot hand, or both of the substrate transfer tool may be relaxed (wider allowable tolerance).

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:

1. A system, comprising:
a substrate chuck;
an actinic radiation source for curing a photocurable composition;
an insertable heating member including a heating element, wherein, in an inserted state, the heating element is disposed between the substrate chuck and the actinic radiation source, and in a retracted state, the heating element is not disposed between the substrate chuck and the actinic radiation source; and
an insertable thermal shield, wherein, in the inserted state, the insertable thermal shield is disposed between the substrate chuck and the actinic radiation source, and in the retracted state, the insertable thermal shield is not disposed between the substrate chuck and the actinic radiation source.

2. The system of claim 1, further comprising:
a first positioning device coupled to the insertable heating member, wherein the first positioning device is configured to move the insertable heating member from the retracted state to the inserted state; and
a second positioning device coupled to the insertable heating member, wherein the second positioning device is configured to move the insertable heating member from the inserted state to the retracted state.

3. The system of claim 1, further comprising:
a first positioning device coupled to the insertable thermal shield, wherein the first positioning device is configured to move the insertable thermal shield from the retracted state to the inserted state; and
a second positioning device coupled to the insertable thermal shield, wherein the second positioning device is configured to move the insertable thermal shield from the inserted state to the retracted state.

4. The system of claim 1, further comprising:
a heating member positioning device coupled to the insertable heating member, wherein the heating member positioning device is configured to move the insert-able heating member from the retracted state to the inserted state and from the inserted state to the retracted state; and
a thermal shield member positioning device coupled to the insertable thermal shield, wherein the heating member positioning device is configured to move the insertable thermal shield from the retracted state to the inserted state and from the inserted state to the retracted state.

5. The system of claim 1, wherein the substrate chuck includes a chucking surface and lift pins, wherein the lift pins are configured to lift a substrate from the chucking surface when the insertable thermal shield is in the inserted state.

6. The system of claim 1, wherein the heating element is configured to transmits at least 70% of an actinic radiation from the actinic radiation source through a thickness of the heating element.

7. The system of claim 1, wherein the substrate chuck comprises a thermal shield and a chucking surface, wherein the thermal shield is disposed along the chucking surface.

8. The system of claim 1, further comprising:
a positioning stage, wherein the substrate chuck comprises a chucking surface and a thermal shield, wherein a center of the thermal shield is disposed between the chucking surface and the positioning stage.

9. The system of claim 1, further comprising a structure comprising the insertable heating member and a thermal shield, wherein the thermal shield is disposed between the heating element and the substrate chuck.

10. A system, comprising:
a substrate chuck;
an actinic radiation source for curing a photocurable composition; and
an insertable thermal shield, wherein, in an inserted state, the insertable thermal shield is disposed between the substrate chuck and the actinic radiation source, and in a retracted state, the insertable thermal shield is not disposed between the substrate chuck and the actinic radiation source.

11. The system of claim 10, further comprising:
a first positioning device coupled to the insertable thermal shield, wherein the first positioning device is configured to move the insertable thermal shield from the retracted state to the inserted state; and
a second positioning device coupled to the insertable thermal shield, wherein the second positioning device is configured to move the insertable thermal shield from the inserted state to the retracted state.

12. The system of claim 10, wherein:
the substrate chuck includes a lift pin comprising a substrate contacting portion and a vertical portion, and
the insertable thermal shield is not disposed directly over or directly under the vertical portion of the lift pin when the insertable thermal shield is in the inserted state.

13. The system of claim 10, wherein:
the substrate chuck includes a lift pin, and
the insertable thermal shield defines a slot such that the lift pin is within the slot when the insertable thermal shield is in the inserted state.

14. The system of claim 10, wherein the insertable thermal shield includes a first layer of a relatively lower thermally conductive material and a second layer of a relatively higher thermally conductive material, wherein the first layer is disposed between the second layer and the substrate chuck.

15. A method, comprising:

placing a superstrate on a layer of a photocurable composition, wherein the layer of the photocurable composition is disposed between the superstrate and a substrate, and the substrate is on a substrate chuck coupled to a positioning stage, while the positioning stage in a first position;

moving a thermal component to a position adjacent to the photocurable composition and the substrate, wherein the thermal component is a thermal shield or a heating member including a heating element;

heating the photocurable composition;

exposing the photocurable composition to actinic radiation while the photocurable composition is at a temperature higher than an ambient temperature, wherein exposing the photocurable composition to the actinic radiation is performed such that a positioning stage temperature of the positioning stage is at least 30° C. below a heated photocurable composition temperature of the photocurable composition while the photocurable composition is exposed to the actinic radiation to form a photocured planarization layer under the superstrate, while the positioning stage is in a second position;

after heating the photocurable composition, moving the thermal component such that it does not directly overlie or directly underlie the photocurable composition and the substrate;

removing the superstrate from the photocured planarization layer while the positioning stage is in the first position;

removing a stack of the photocured planarization layer and the substrate from the substrate chuck; and baking the stack at a baking temperature for a soak time, wherein the heated photocurable composition temperature of the photocurable composition is selected based on the baking temperature for the soak time.

16. The method of claim 15, wherein moving the thermal component comprises moving the heating member.

17. The method of claim 16, further comprising:

before heating the photocurable composition, moving the thermal shield such that the thermal shield is disposed between and the substrate chuck and the substrate; and after heating the photocurable composition, moving the thermal shield such that the thermal shield is not disposed between the substrate chuck and the substrate.

18. The method of claim 15, wherein moving the thermal component comprises moving the thermal shield.

19. The method of claim 18, further comprising lifting the substrate such that it is spaced apart from a chucking surface of the substrate chuck, wherein moving the thermal shield is performed such that the thermal shield extends beyond opposite points along a peripheral edge of the substrate.

* * * * *